United States Patent
Lee et al.

(10) Patent No.: US 9,673,371 B2
(45) Date of Patent: Jun. 6, 2017

(54) ANISOTROPICALLY ELONGATED THERMOELECTRIC MATERIAL, PROCESS FOR PREPARING THE SAME, AND DEVICE COMPRISING THE MATERIAL

(75) Inventors: Sang-mock Lee, Yongin-si (KR); Prabhakar Bandaru, San Diego, CA (US); Sung-ho Jin, San Diego, CA (US)

(73) Assignees: SAMSUNG ELECTRONICS CO., LTD., Gyeonggi-Do (KR); THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 1019 days.

(21) Appl. No.: 12/539,254

(22) Filed: Aug. 11, 2009

(65) Prior Publication Data
US 2010/0236596 A1  Sep. 23, 2010

Related U.S. Application Data

(60) Provisional application No. 61/136,088, filed on Aug. 11, 2008.

(51) Int. Cl.
| | | |
|---|---|---|
| H01L 35/14 | (2006.01) | |
| H01L 35/34 | (2006.01) | |
| B82Y 30/00 | (2011.01) | |
| C04B 35/547 | (2006.01) | |
| H01L 35/22 | (2006.01) | |
| H01L 35/26 | (2006.01) | |

(52) U.S. Cl.
CPC ............. *H01L 35/34* (2013.01); *B82Y 30/00* (2013.01); *C04B 35/547* (2013.01); *H01L 35/22* (2013.01); *H01L 35/26* (2013.01); *C04B 2235/5436* (2013.01); *C04B 2235/781* (2013.01)

(58) Field of Classification Search
CPC ...................................................... H01L 35/34
See application file for complete search history.

(56) References Cited

U.S. PATENT DOCUMENTS

| 2006/0032526 A1 | 2/2006 | Fukutani et al. |
| 2006/0134397 A1 | 6/2006 | Smith |
| 2006/0243314 A1* | 11/2006 | Ota et al. ...................... 136/200 |
| 2007/0224399 A1 | 9/2007 | Rabin et al. |
| 2008/0173344 A1 | 7/2008 | Zhang et al. |

FOREIGN PATENT DOCUMENTS

JP  2004-193526 A  7/2004

OTHER PUBLICATIONS

Wei et al., Synthesis of single crystal bismuth-telluride and lead-telluride nanowires for new thermoelectric materials, Mat. Res. Soc. Symp. Proc. vol. 581, 2000, pp. 219-223.*
Co Pt Patterned Media in Anodized Aluminum Oxide Templates; A.I. Gapin, et al., Journal of Applied Physics 99, 08G902 (2006); Presened Nov. 1, 2005; Published Online Apr. 18, 2006.
Large Anisotropic Thermal Conductivity in Synthetic Diamond Films; J.E. Graebner, et al., Nature vol. 359 Oct. 1, 1992; Letters to Nature; pp. 401-403.

(Continued)

*Primary Examiner* — Shannon Gardner
(74) *Attorney, Agent, or Firm* — Cantor Colburn LLP

(57) ABSTRACT

An anisotropically elongated thermoelectric nanocomposite includes a thermoelectric material.

34 Claims, 24 Drawing Sheets

(56) References Cited

OTHER PUBLICATIONS

Mesoporous Silicates Prepared Using Preorganized Templates in Supercritical Fluids; Rajaram A. Pai, et al.; Science 303, vol. Jan. 23, 2004; DOI: 10.1126/SCIENCE.1092627; pp. 506-510.
Block Copolymer Lithography: Periodic Arrays of~1011 Holes in 1 Square Centimeter; Miri Park, et al., Science vol. 276, May 30, 1997; DOI: 10.1126/SCIENCE vol. 276.5317.1401; pp. 1400-1404.
International Search Report for International Application No. PCT/KR2009/004476 dated Mar. 19, 2010.

* cited by examiner

FIG. 2A

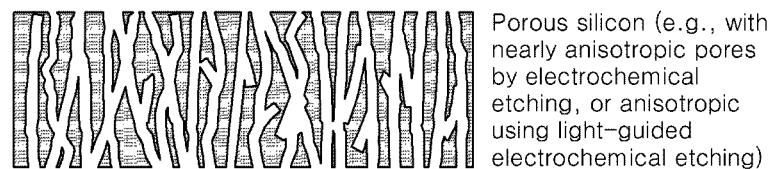

Porous silicon (e.g., with nearly anisotropic pores by electrochemical etching, or anisotropic using light-guided electrochemical etching)

FIG. 2B

Nanoporous silica ($SiO_x$ or $SiO_2$) by thermal oxidation of porous Si. The pore diameter is desirably reduced by oxidation.

FIG. 2C

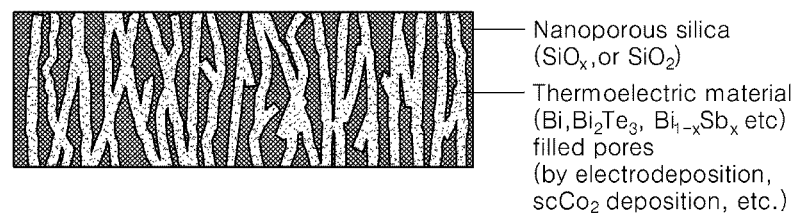

Nanoporous silica ($SiO_x$, or $SiO_2$)

Thermoelectric material ($Bi, Bi_2Te_3, Bi_{1-x}Sb_x$ etc) filled pores (by electrodeposition, $scCo_2$ deposition, etc.)

Thin film Al with nanocavity array

Guided anodized Al$_2$O$_3$ film with nanocavity array

AAO film filled with thermoelectric material

Bulk Al sheet with nanoindented pit array

Guided anodized $Al_2O_3$ sheet with aligned vertical nanocavity array

Nanowire thermoelectric material in AAO

FIG. 8A

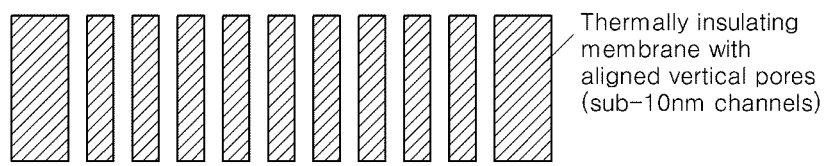

Thermally insulating membrane with aligned vertical pores (sub-10nm channels)

FIG. 8B

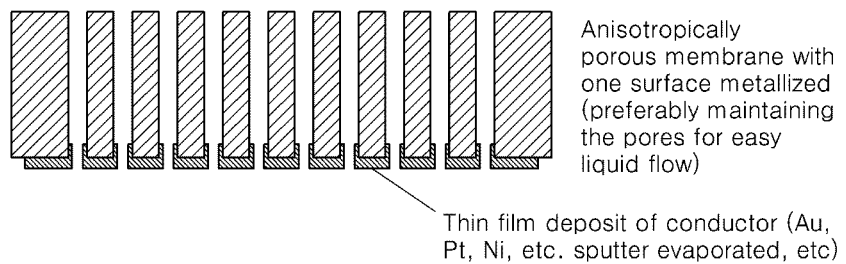

Anisotropically porous membrane with one surface metallized (preferably maintaining the pores for easy liquid flow)

Thin film deposit of conductor (Au, Pt, Ni, etc. sputter evaporated, etc)

FIG. 8C

Thermoelectriv material (Bi, $Bi_2Te_3$, $Bi_{1-x}Sb_x$ etc) filled in the pores

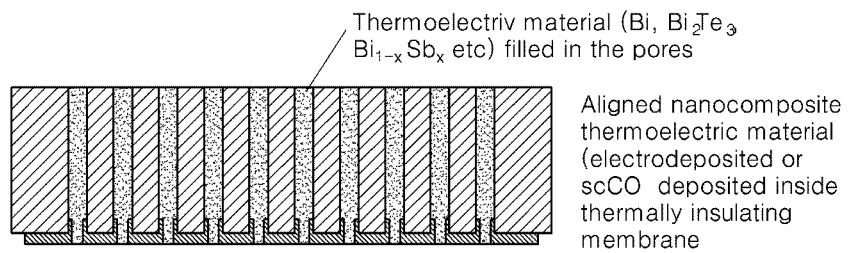

Aligned nanocomposite thermoelectric material (electrodeposited or scCO deposited inside thermally insulating membrane

FIG. 9

Membrane with vertically aligned pores (optionally one surface sputter coated with electrically conductive film to allow electroplating with ease of electrolyte or supercritical $CO_2$ vapor transport through the pores). The nanopores(less than ~10 nm dia, preferably less than ~6 nm) are then filled with thermoelectric materials (Bi, $Bi_2Te_3$, $Bi_{1-x}Sb_x$ etc) by electroplating, supercritical $CO_2$ deposition, etc.

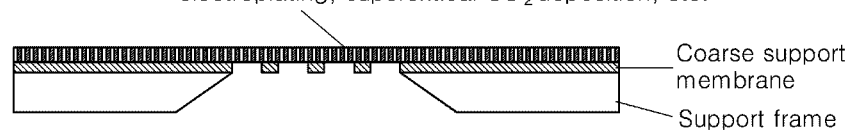

Coarse support membrane

Support frame

FIG. 10A

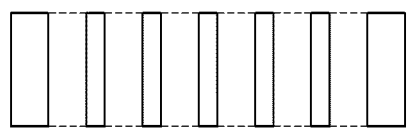

Prepare AAO template with relatively easy fabrication of 50nm dia. periodic pores, 0.5mm thick

FIG. 10B

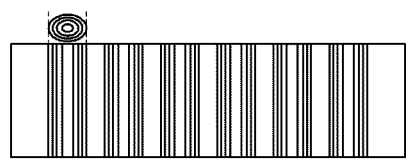

Deposit alternating layers of [TE layer + Al layer]$_n$ into the pore. Optionally co-deposit precipitating metal or phase (e.g., by off-stoichiometric composition or by co-depositing an oxide-dispersoid forming element such as Ti, Zr, Al, rare earth, etc. to reduce thermal conductivity K of TE material.

FIG. 10C

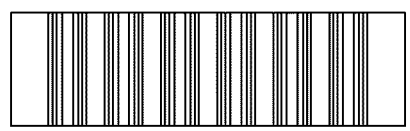

[TE +Al2O3]n circular superlattice by oxidizing Al into Al2O3 by heating in O2 to 400-700°C + optional H2 reduction to reduce Bi and Te back to metallic state.

FIG. 11A

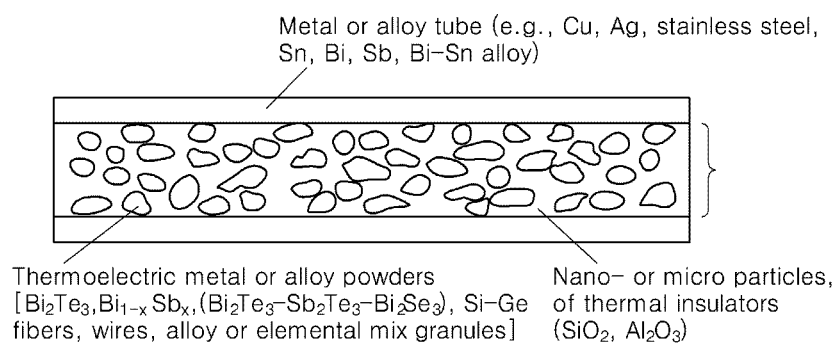

Metal or alloy tube (e.g., Cu, Ag, stainless steel, Sn, Bi, Sb, Bi-Sn alloy)

Thermoelectric metal or alloy powders
[$Bi_2Te_3$, $Bi_{1-x}Sb_x$, ($Bi_2Te_3$-$Sb_2Te_3$-$Bi_2Se_3$), Si-Ge fibers, wires, alloy or elemental mix granules]

Nano- or micro particles, of thermal insulators ($SiO_2$, $Al_2O_3$)

FIG. 11B

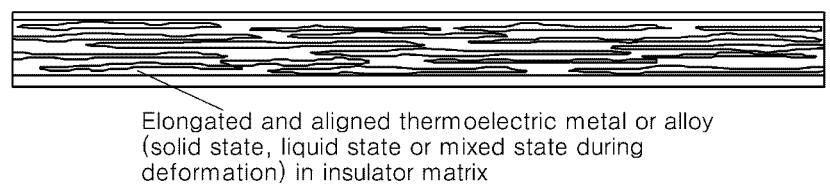

Elongated and aligned thermoelectric metal or alloy (solid state, liquid state or mixed state during deformation) in insulator matrix

FIG. 11C

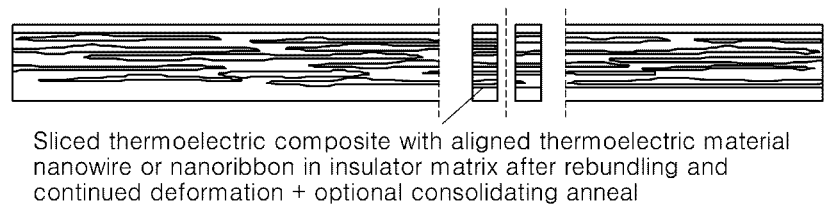

Sliced thermoelectric composite with aligned thermoelectric material nanowire or nanoribbon in insulator matrix after rebundling and continued deformation + optional consolidating anneal

FIG. 15A

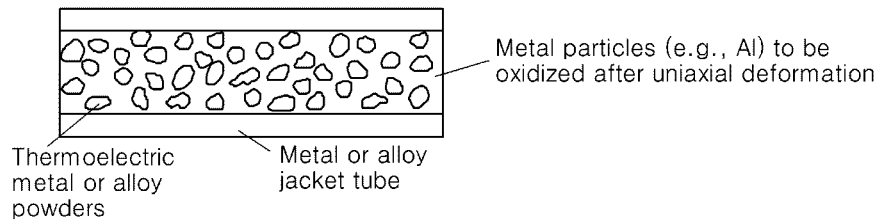

Thermoelectric metal or alloy powders

Metal or alloy jacket tube

Metal particles (e.g., Al) to be oxidized after uniaxial deformation

FIG. 15B

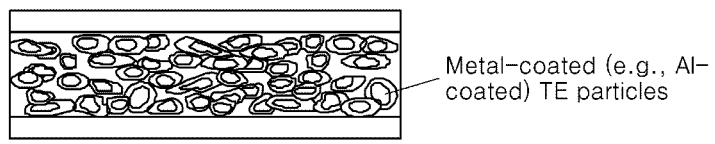

Metal-coated (e.g., Al-coated) TE particles

FIG. 15C

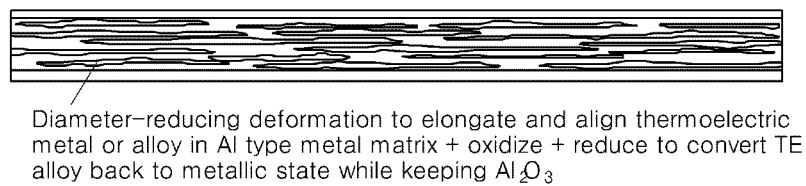

Diameter-reducing deformation to elongate and align thermoelectric metal or alloy in Al type metal matrix + oxidize + reduce to convert TE alloy back to metallic state while keeping $Al_2O_3$

FIG. 15D

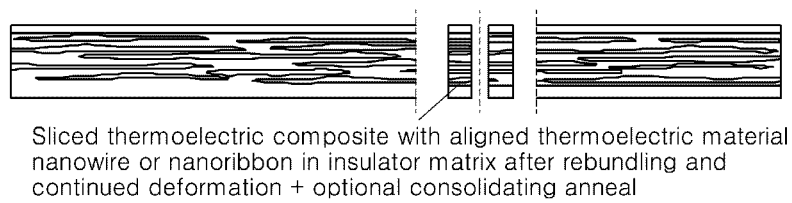

Sliced thermoelectric composite with aligned thermoelectric material nanowire or nanoribbon in insulator matrix after rebundling and continued deformation + optional consolidating anneal

FIG. 16A

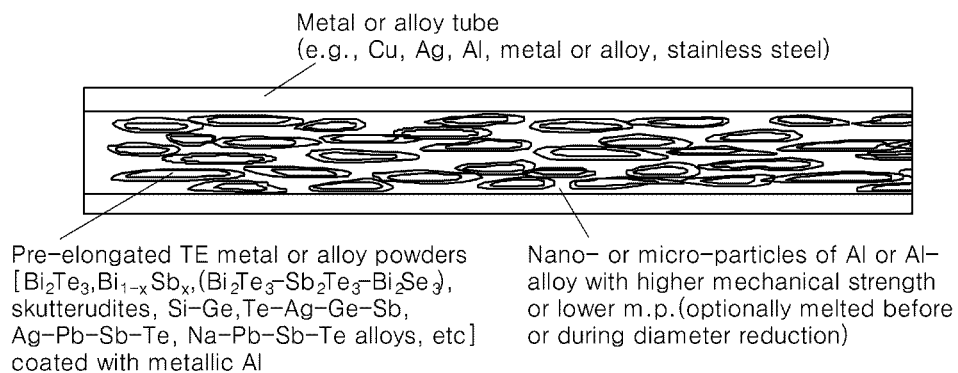

Metal or alloy tube
(e.g., Cu, Ag, Al, metal or alloy, stainless steel)

Pre-elongated TE metal or alloy powders
[$Bi_2Te_3$, $Bi_{1-x}Sb_x$, ($Bi_2Te_3$-$Sb_2Te_3$-$Bi_2Se_3$),
skutterudites, Si-Ge, Te-Ag-Ge-Sb,
Ag-Pb-Sb-Te, Na-Pb-Sb-Te alloys, etc]
coated with metallic Al Nano- or micro-particles of Al or Al-
alloy with higher mechanical strength
or lower m.p. (optionally melted before
or during diameter reduction)

FIG. 16B

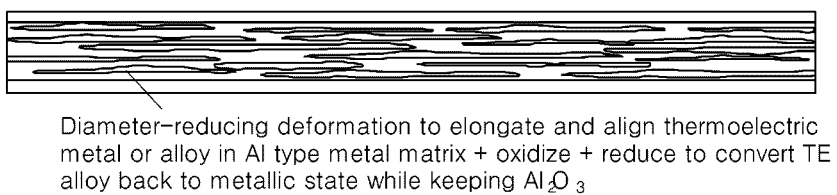

Diameter-reducing deformation to elongate and align thermoelectric
metal or alloy in Al type metal matrix + oxidize + reduce to convert TE
alloy back to metallic state while keeping $Al_2O_3$

FIG. 16C

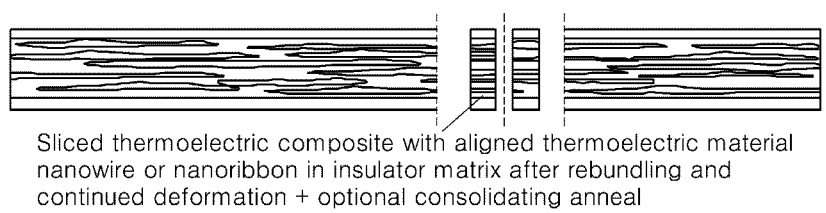

Sliced thermoelectric composite with aligned thermoelectric material
nanowire or nanoribbon in insulator matrix after rebundling and
continued deformation + optional consolidating anneal

FIG. 17A

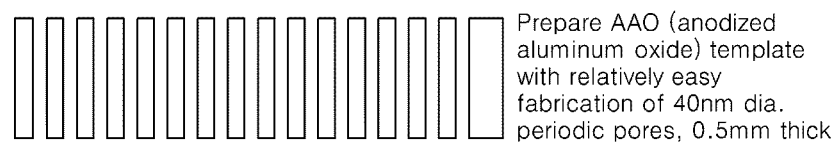

Prepare AAO (anodized aluminum oxide) template with relatively easy fabrication of 40nm dia. periodic pores, 0.5mm thick

FIG. 17B

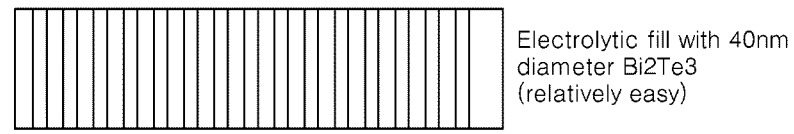

Electrolytic fill with 40nm diameter Bi2Te3 (relatively easy)

FIG. 17C

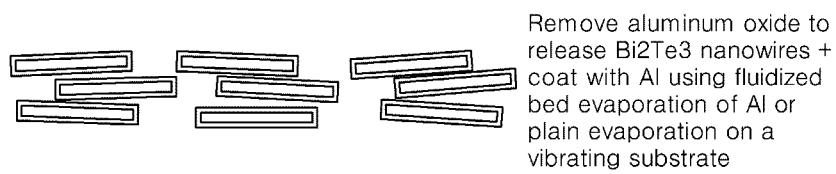

Remove aluminum oxide to release Bi2Te3 nanowires + coat with Al using fluidized bed evaporation of Al or plain evaporation on a vibrating substrate

FIG. 17D

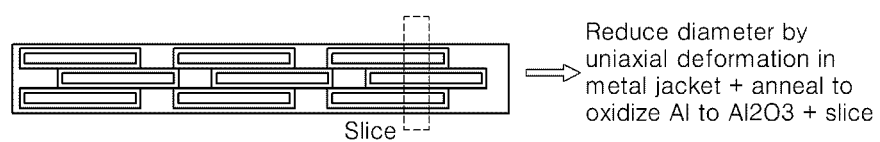

Reduce diameter by uniaxial deformation in metal jacket + anneal to oxidize Al to Al2O3 + slice

FIG. 18A

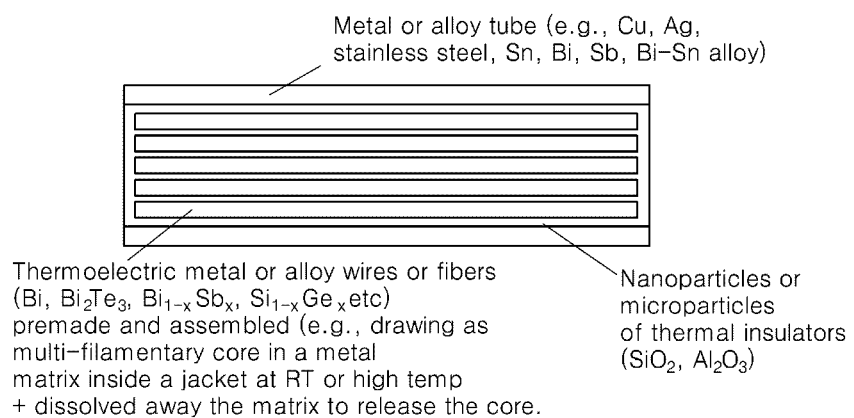

Metal or alloy tube (e.g., Cu, Ag, stainless steel, Sn, Bi, Sb, Bi-Sn alloy)

Thermoelectric metal or alloy wires or fibers
(Bi, $Bi_2Te_3$, $Bi_{1-x}Sb_x$, $Si_{1-x}Ge_x$ etc)
premade and assembled (e.g., drawing as
multi-filamentary core in a metal
matrix inside a jacket at RT or high temp
+ dissolved away the matrix to release the core.

Nanoparticles or microparticles of thermal insulators ($SiO_2$, $Al_2O_3$)

FIG. 18B

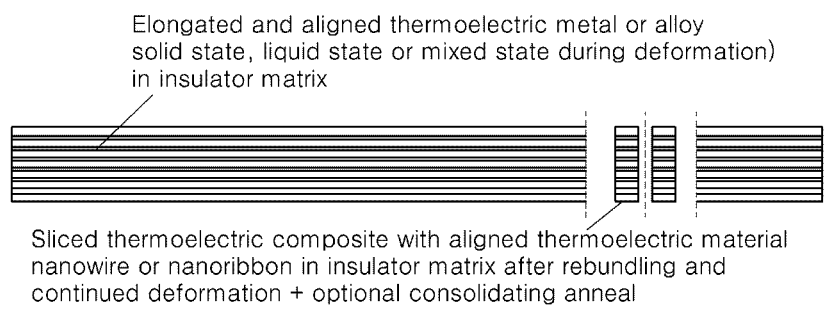

Elongated and aligned thermoelectric metal or alloy
solid state, liquid state or mixed state during deformation)
in insulator matrix Sliced thermoelectric composite with aligned thermoelectric material
nanowire or nanoribbon in insulator matrix after rebundling and
continued deformation + optional consolidating anneal

FIG. 19A

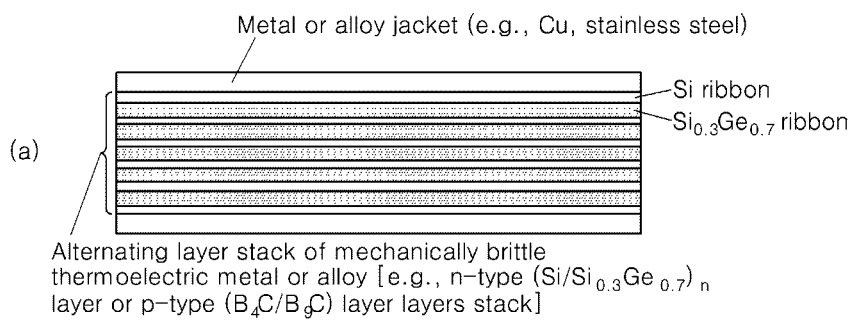

(a)

Metal or alloy jacket (e.g., Cu, stainless steel)
Si ribbon
$Si_{0.3}Ge_{0.7}$ ribbon Alternating layer stack of mechanically brittle
thermoelectric metal or alloy [e.g., n-type $(Si/Si_{0.3}Ge_{0.7})_n$
layer or p-type $(B_4C/B_9C)$ layer layers stack]

FIG. 19B

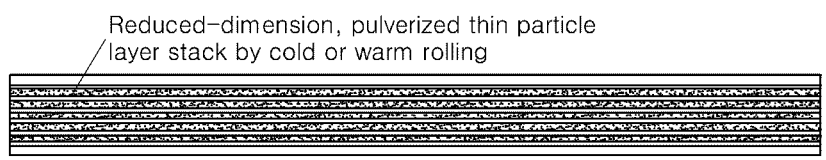

Reduced-dimension, pulverized thin particle
layer stack by cold or warm rolling

FIG. 19C

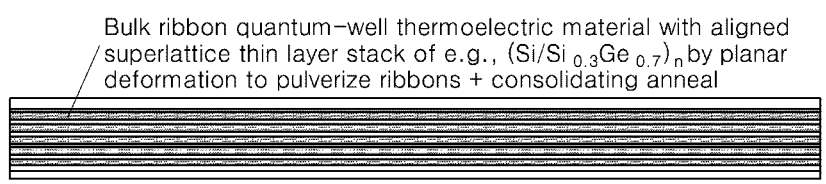

Bulk ribbon quantum-well thermoelectric material with aligned
superlattice thin layer stack of e.g., $(Si/Si_{0.3}Ge_{0.7})_n$ by planar
deformation to pulverize ribbons + consolidating anneal FIG. 22
(a) Surface roughness defects on TE nanofibers
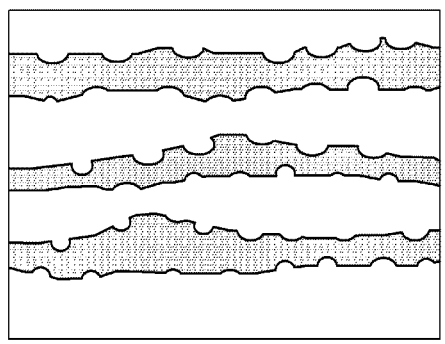
(b) Internally pushed in nanparticle defects in TE nanofibers
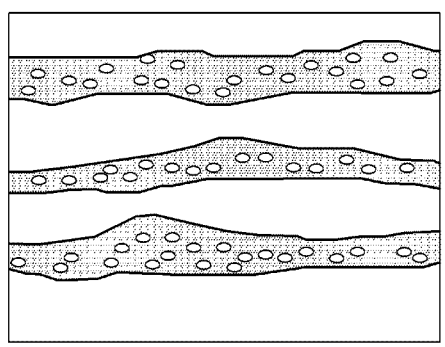

ANISOTROPICALLY ELONGATED THERMOELECTRIC MATERIAL, PROCESS FOR PREPARING THE SAME, AND DEVICE COMPRISING THE MATERIAL

CROSS-REFERENCE TO RELATED APPLICATION

This application claims priority to U.S. Provisional Application No. 61/136,088, filed on Aug. 11, 2008, and all the benefits accruing therefrom under 35 U.S.C. §119, the content of which in its entirety is herein incorporated by reference.

BACKGROUND

1. Field

One or more exemplary embodiments relate to an anisotropically elongated thermoelectric material, a process for preparing the same, and a device comprising the anisotropically elongated thermoelectric material.

2. Description of the Related Art

The technical field of thermoelectric materials and devices has expanded significantly in recent years because of their potential use in efficient solid state cooling and power generation. Bulk thermoelectric materials are generally considered to be relatively inefficient for energy conversion or energy transport applications. However, with the advent of nanotechnology and better materials fabrication tools, artificially fabricated quantum confined structures, such as quantum wells, have shown promise for greatly increasing the thermal to electrical energy conversion efficiency of thermoelectric materials and devices.

In recent years, studies on these structures have shown a steadily increasing figure of merit (hereinafter referred to as "ZT"). Generally, the efficiency of a material's thermoelectric performance is quantified by the figure of merit ZT, where T is the temperature of operation, and $Z (=S^2\sigma/\kappa)$ where S is the Seebeck Coefficient (in Volts/degree K), $\sigma$ is the electrical conductivity (in 1/W-meter), and $\kappa$ is the thermal conductivity (in Watt/meter-degree K). The Seebeck Coefficient S depends on the density of state ("DOS"). For reduced dimensions, for example, in two-dimensional quantum wells or one dimensional nanowires, the DOS becomes much higher than the 3-dimensional bulk materials. The higher DOS thus leads to higher S and higher $\sigma$ values. The thermal conductivity $\kappa$ becomes smaller if the dimension involved is less than the phonon wavelength.

It is now commonly accepted that a high ZT, e.g., ZT>1, would result in thermoelectric materials useful for various applications such as heat recovery, space power applications, and an even higher ZT, e.g., ZT>3 would significantly stimulate technology replacement in devices such as power generators and heat pumps and other similar devices. It has also been found that dimensional restriction can lead to a much enhanced efficiency over traditionally used bulk thermoelectrics.

It would thus be beneficial to develop new and improved thermoelectric materials based on bulk processing of unique anisotropic-structured and one dimensionally confined nano configurations as described in the detailed description below.

SUMMARY

One or more exemplary embodiments include an anisotropically elongated thermoelectric nanocomposite including a thermoelectric material.

According to an exemplary embodiment of the present invention, the thermoelectric material is elongated in geometry and is embedded in an insulating matrix.

One or more exemplary embodiments include an anisotropically elongated, concentrically superlatticed thermoelectric nanocomposite including; a plurality of multi-layered nanowire structures embedded in a nanoporous or nonporous insulating matrix, wherein each of the plurality of multi-layered nanowire structures includes a multi-layered cylindrical thermoelectric material, and an insulating layer deposited between layers of the multi-layered cylindrical thermoelectric material.

According to another exemplary embodiment of the present invention, the multi-layers of the cylindrical thermoelectric material have at least 3 layers of the cylindrical thermoelectric material.

One or more exemplary embodiments include a uniaxially deformed thermoelectric nanocomposite including thermoelectric material embedded in an electrically and thermally insulating material.

One or more exemplary embodiments include a method of fabricating a uniaxially deformed thermoelectric nanocomposite, the method including the steps of; preparing a plurality of composite performs, each composite perform consisting of a plurality of thermoelectric material powders and electrical and thermal insulator particles, the plurality of thermoelectric material powders and electrical and thermal insulator particles being placed inside a metal jacket, sealing the metal jacket of each composite perform, applying a uniaxial deformation to each metal jacket to reduce the diameter of and elongate the metal jacket into a rod form to form a plurality of uniaxially deformed, diameter-reduced rods, bundling the plurality of uniaxially deformed, diameter-reduced rods, placing the plurality of uniaxially deformed, diameter-reduced rods in a larger metal jacket, applying uniaxial deformation to the larger metal jacket to obtain a uniaxially deformed thermoelectric nanocomposite.

One or more exemplary embodiments provide a method of forming a uniaxially deformed thermoelectric nanocomposite, the method including the steps of; preparing a plurality of composite performs, each composite preform consisting of a plurality of thermoelectric material powders mixed with at least one of a plurality of oxidizable metal particles and metal coating, the plurality of thermoelectric material powders mixed with at least one of a plurality of oxidizable metal particles and metal coating being packed inside a metal jacket, sealing the metal jacket of each composite perform, applying a uniaxial deformation to each metal jacket to reduce the diameter thereof and elongate the metal jacket into a rod form to form a plurality of uniaxially deformed, diameter-reduced rods, bundling the plurality of uniaxially deformed, diameter-reduced rods, placing the plurality of uniaxially deformed, diameter reduced rods in a larger metal jacket, applying uniaxial deformation to the larger metal jacket to obtain a uniaxially deformed thermoelectric nanocomposite, oxidizing the at least one of an oxidizable metal and metal coating via heat treatment in an oxidizing atmosphere, and reducing the uniaxially deformed thermoelectric nanocomposite from an oxidized state to restore the uniaxially deformed thermoelectric nanocomposite to a metallic state via heat treatment in a reducing atmosphere.

One or more exemplary embodiments include randomly and locally superlatticed thermoelectric nanocomposites by dimension-reducing deformation of well-mixed particles of two brittle components inside a metal jacket with fusion annealing applied after desired reduction in the jacket diameter, with the composite made of Si, Si—Ge particles.

One or more exemplary embodiments provide devices and articles comprising the above thermoelectric nanocomposites for various applications including solar energy conversion to electricity using the temperature differential between sunny, hot regions and cooler shaded regions.

BRIEF DESCRIPTION OF THE DRAWINGS

The nature, advantages and various additional features of the invention will appear more fully upon consideration of the illustrative exemplary embodiments now to be described in detail with the accompanying drawings. In the drawings:

FIGS. 2A-2C schematically illustrate an exemplary embodiment of an array of nearly anisotropic thermoelectric material in a one dimensional nanowire configuration in an insulating nanoporous silica matrix;

FIGS. 8A-8C schematically illustrate another exemplary embodiment of a method of electro-depositing thermoelectric material into sub-10 nm anisotropic nanopores in an insulating matrix;

FIG. 9 schematically illustrates an exemplary embodiment of an assembly comprising an anisotropically nanoporous insulator membrane suitably supported for electrodeposition of thermoelectric nanowires;

FIGS. 10A-10C schematically illustrate an exemplary embodiment of fabrication of nanoscaled and anisotropic bulk thermoelectric materials;

FIGS. 11A-11C illustrate yet another exemplary embodiment of elongated and aligned thermoelectric metals/alloys assembly structures according to the present invention obtained by uniaxial deformation in an insulator matrix;

FIGS. 15A-15D illustrates the steps involved in an exemplary embodiment of the fabrication of elongated and anisotropically aligned TE nanofiber arrays physically separated by electrically and thermally insulating aluminum oxide material, starting from the metal coated TE particles described in FIGS. 12-14;

FIGS. 16A, 16B and 16C schematically illustrate exemplary embodiments of steps for preparing elongated and anisotropically aligned TE nanofiber arrays from pre-elongated and metal coated TE fibers through dimensional reduction and alignment followed by oxidation/reduction annealing cycle according to the present invention;

FIGS. 17A-17D illustrate an exemplary embodiment of a method for fabricating thermoelectric nanocomposites according to the present invention;

FIGS. 18A and 18B illustrate another exemplary embodiment of anisotropically aligned thermoelectric metals/alloys assembly structure obtained by uniaxial deformation of metallic wires/fibers/ribbons preform arrays in an insulator matrix according to the present invention;

FIGS. 19A-19C illustrates yet another exemplary embodiment of quasi quantum-well thermoelectric material nanocomposites with anisotropically aligned microstructure, obtained by bulk fabrication planar deformation in an insulator matrix according to the present invention;

FIGS. 22A and 22B schematically illustrate exemplary embodiments of deformation-induced defects in anisotropically aligned thermoelectric nanofiber structures with resultant enhanced phonon scattering and improved ZT performance according to the present invention;

DETAILED DESCRIPTION

Figure 1:
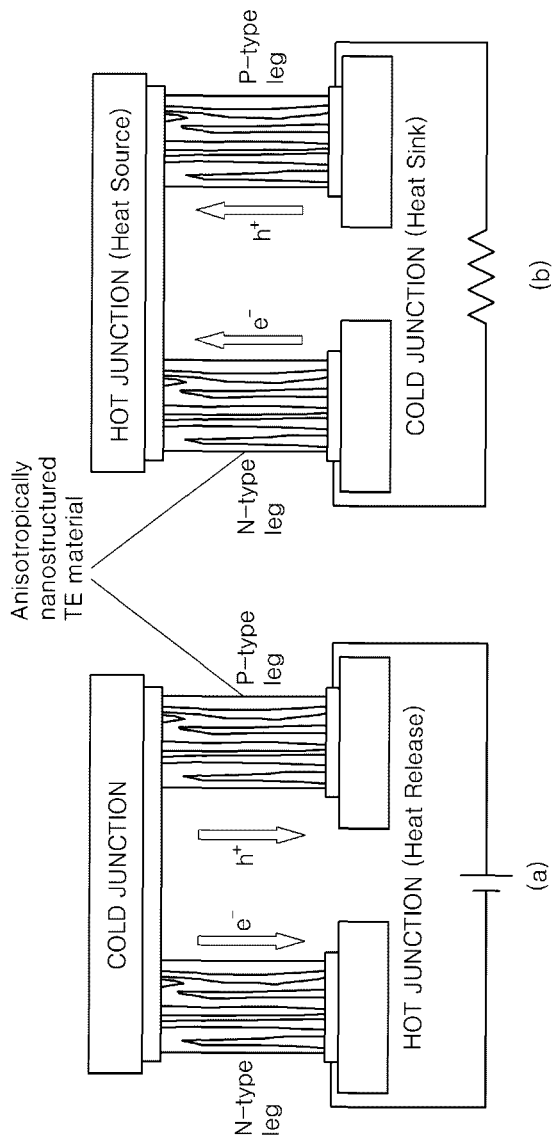
FIGS. 1A and 1B are schematic illustrations of assembled thermoelectric devices comprising inventive, bulk anisotropically structured composite materials.

Hereinafter, the present invention will now be described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

According to exemplary embodiments of the present invention, the basic configuration of a thermoelectric ("TE") device consists of two anisotropically nanostructured legs, specifically the n-type and the p-type legs, which are connected thermally in parallel and electrically in series as illustrated in the exemplary embodiment of FIGS. 1A and 1B. The thermoelectric materials having anisotropically elongated nanofiber type configurations include various metal or alloy systems including Si, $Si_{1-x}Ge_x$ (wherein $0<x<1$), $Bi_2Te_3$, $Sb_2Te_3$, $Bi_xSb_{2-x}Te_3$ (wherein $0<x<2$), $Bi_2Te_xSe_{3-x}$ (wherein $0<x<3$), $B_4C/B_9C$, BiSb alloys, and PbTe, MgSi, MgGe, MgSn, or their ternary systems, binary, ternary or quaternary skutterudites (e.g., $CeFeCoSb_3$, $Ba_3Ni_{0.05}Co_{3.95}Sb_{12}$), and Lead Antimony Silver Tellurium PbSbAgTe ("LAST") thermoelectric alloys.

In addition to the often quoted ZT figure of merit, it is often desirable, from a fundamental point of view, to consider the "materials figure of merit" of potential thermoelectric materials, especially for the optimization of the electronic properties thereof. The materials figure of merit is defined in terms of the mobility ($\mu$) the band effective mass ($m^*$), and the lattice thermal conductivity ($\kappa$ L) and the temperature (T) of the materials as:

$$\beta = (const.)\frac{(m^*)^{1.5}\mu T^{2.5}}{\kappa_L} \quad \text{(eq. 1)}$$

Exemplary embodiments include configurations wherein the optimization of the $m^*$ and $\mu$ variables are accomplished through judicious band structure engineering.

In Silicon-Germanium alloys, the lattice mismatch of Si and Ge (up to 4.2%) is often used as an engineering parameter for device fabrication. One exemplary embodiment thereof is the engineering of valence band masses, which is used in virtually all semiconductor lasers and detectors. Following the conduction band structure of Si—Ge alloys, strain breaks the degeneracy of the conduction band valleys allowing one/more particular bands to dominate the conduction process. The resultant inter-valley scattering is utilized to enhance the materials figure of merit of thermoelectric material.

In Si-rich alloys there are six conduction band ("CB") minima in the six cubic directions that are labeled as the X-directions, i.e., six-fold degeneracy. In Ge-rich alloys, there are four CBminima located at the {111} faces of the Brillouin zone, labeled L. Under strain, say in the <111> direction, the four CB valleys of Ge split, so that one of them is lower in energy, while the other three valleys remain degenerate. While Si/Si—Ge materials have been made into thin film layered superlattices, bulk structures comprising nanoscale, localized interface interactions/phonon-scattering have not been reported.

The components in the thermoelectric materials figure of merit, (Eq. 1) $m^*$ and the mobility ($\mu$) depend on the band degeneracy ($N_v$) relating to the number of valleys in the CB/VB. Note that the effects of the CB are exclusively being looked at in this case. In such a case $m^*$ is proportional to $N_v^{2/3}$, implying that a multi-valley semiconductor has higher potential to exhibit favorable thermoelectric properties. Detailed calculations show that the product $(m^*)^{1.5}$ is proportional to the total number of valleys $N_v$, where each valley has a small inertial effective mass. The above theory also finds justification in that the best materials for thermoelectric application, at all temperatures, have multi-valley band structures. This includes $Bi_2Te_3$ and $Bi_2Se_3$ alloys (a six valley model for both the CB and the VB), BiSb alloys, and PbTe and related compounds. $B_4C$ or $B_9C$ compound type materials are stable at high temperatures and provide very high device efficiencies. These boron carbide based thermoelectric materials are unusual in that, while highly doped, their Seebeck coefficients remain relatively constant with increasing temperature.

Both the superlattice multilayer and nanowire configurations are desirable as such materials engineering can be designed to take full advantage of the enhanced Seebeck effect due to quantum confinement and to maximize the thermoelectric conversion efficiencies.

Various exemplary embodiments representing unique structures with intentionally induced lateral confinement of thermoelectric materials are disclosed according to the present invention as described below. Exemplary embodiments of methods of fabricating the unique structures with intentionally induced lateral confinement of thermoelectric materials and exemplary embodiments of methods for manufacturing the thermoelectric materials with intentionally induced lateral confinement are also disclosed.

Exemplary Embodiment 1: Anisotropically Elongated Thermoelectric Nanocomposite Comprising Thermoelectric Material A one dimensional thermoelectric ("TE") nanowire array is desirable for use as a thermoelectric material because the added lateral electrical and thermal constriction provides an additional degree of quantum confinement in the lateral directions. Such nanowire confinement effect becomes pronounced when the nanowire average diameter is less than, or equal to, about 10 nm. When the TE material has a nanowire structure, exemplary embodiments include configurations wherein the average aspect ratio of length to diameter of the TE material is at least about 2, and in one exemplary embodiment may be at least about 5.

The TE material can be at least one selected from a group consisting of Si, $Si_{1-x}Ge_x$ (wherein 0<x<1), $Bi_2Te_3$, $Sb_2Te_3$, $Bi_xSb_{2-x}Te_3$ (wherein 0<x<2), $Bi_2Te_xSe_{3-x}$ (wherein 0<x<3), $B_4C/B_9C$, BiSb alloys, and PbTe, Mg—Si, Mg—Ge, Mg—Sn or their ternary systems, binary, tertiary or quaternary skutterudites (e.g., $CeFeCoSb_3$, $Ba_3Ni_{0.05}CO_{3.95}Sb_{12}$), and Lead-Antimony-Silver-Tellurium Pb—Sb—Ag—Te TE alloys.

According to the present exemplary embodiment of the invention, the TE alloy nanowires material is elongated in geometry and is embedded in a nanoporous, or in alternative exemplary embodiments non-porous, insulating matrix. Exemplary embodiments of the insulating matrix comprises nanoporous oxide, nitride or fluoride aligned along the elongation direction of the TE nanocomposite. The nanoporous oxide can be at least one selected from a group consisting of $SiO_2$, $Al_2O_3$, or oxides of Ti, Zr, Hf, Nb, Ta and their alloys. Exemplary embodiments include configurations wherein the amount of the insulating matrix can be less than about 60%, for example about 30%, of the TE nanocomposite based on volume.

One of the exemplary embodiments disclosed in this invention includes the use of pore structures aligned along the direction of the elongation. Another exemplary embodiment to exploit quantum confinement to achieve high TE figures of merit is through reduction of TE components using plastic deformation of a jacketed thermoelectric material.

For example, one exemplary embodiment includes the formation of nanoscale porosity on electrochemical etching of Si (oriented to be substantially perpendicular to the Si surface). Further enhanced anisotropic pore alignment is obtained in porous Si if light illumination is used during the electrochemical etching. According to exemplary embodiments of the present invention, such nanoporous Si can be oxidized to further reduce the pore diameter, and also to convert the Si matrix material to $SiO_2$ as illustrated in FIGS. 2A-2C.

Figure 3:
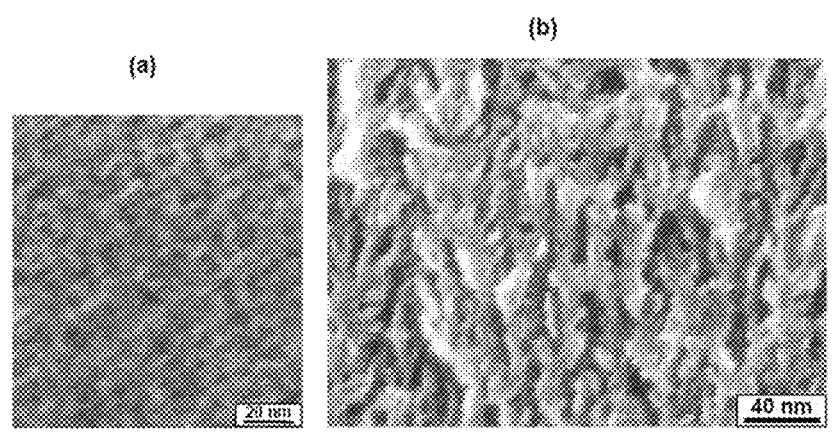
FIGS. 3A and 3B are scanning electron microscope ("SEM") pictures showing a top view and a cross-sectional view, respectively, of an exemplary embodiment of a porous silicon precursor.

Scanning electron microscopy ("SEM") microstructures of the precursor porous Si sample are shown in FIGS. 3A-3B. The nanopores are somewhat aligned along the direction of electrochemical etch using about 20% hydrofluoric acid ("HF") solution at current densities of about 40 $mA/cm^2$ for about 10 minutes produce about 30 micrometer depth etching into Si. The average pore diameter was about 6 nm, and the average density of the pores was about 50%. After oxidation at high temperature (e.g., 200° C.-1100° C. for about 1 min-to about 24 hrs in an oxygen or water vapor environment), the porous Si is converted to porous silica, and the average pore diameter is reduced substantially, for example, to about 2 nm to about 5 nm, the degree of which depends on the oxidation temperature, time and the oxygen content during the heat treatment.

While $SiO_2$ has a relatively lower thermal conductivity among various oxide materials including ceramics like $Al_2O_3$, alternative exemplary embodiments including other oxide materials, such as $Al_2O_3$, may be used. Metals such as Al, Ti, Zr, Hf, Nb, Ta, or their alloys can be electrochemically etched and converted into oxides while producing directional nanopore arrays. Preparation of sub-10 nm vertical pores is generally not easy.

For fabrication of desired sub-10 nm pores in these ceramics, exemplary embodiments of the present invention utilize guided anodization. Guided anodization using nano-indentation of thin film metals or foils, as illustrated in FIGS. 4A-C, 5A-C and 6A-C, or nano-mask patterning, as illustrated in FIG. 7, can be utilized for nucleation of etch pits and continued creation of sub 10 nm, aligned nanopores.

Figure 4A:
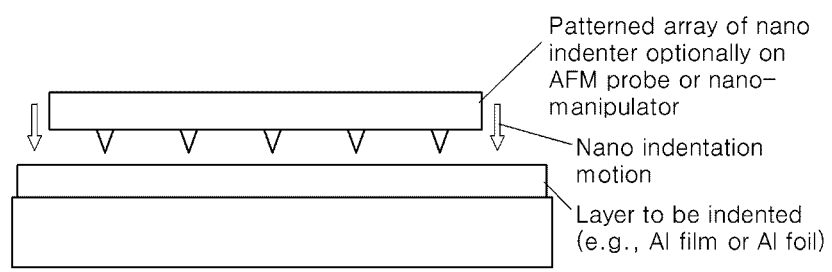
FIGS. 4A-4C schematically illustrate an exemplary embodiment of a method to prepare array nano indentation to nucleate anodization on an Al surface.
Figure 4B:
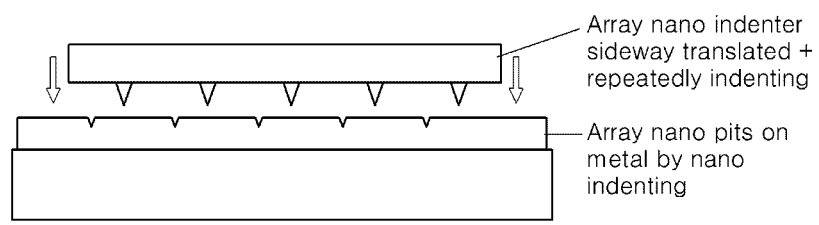
Figure 4C:
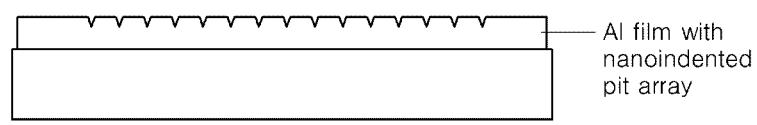

The nano-indented spots (pits) serve as nucleation sites for anodization reactions, thus the nano-indented spots induce the vertical nanopores at specific sites. Exemplary embodiments of the nano-indenter, e.g., made of Si tips or carbon nanotips, can be mounted on a nano-imprint machine or an atomic force microscope ("AFM") type cantilever having an x-y-z controllable nanomanipulator, and can be moved laterally stepwise and then pressed downward to induce additional indentations as illustrated in FIGS. 4A-C. These guided anodization spots can also be utilized to introduce other self-assembled anodization spots in between.

Figure 5A:
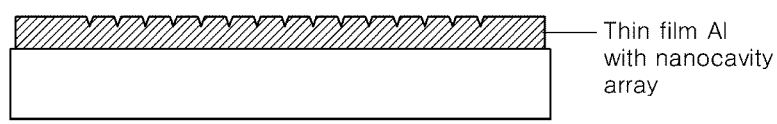
FIGS. 5A-5C schematically illustrate an exemplary embodiment of a method for fabricating at least one of a thin film, (or alternatively a thick film, thermoelectric material with sub-10 nm nanowire array in an insulating matrix on a substrate.
Figure 5B:
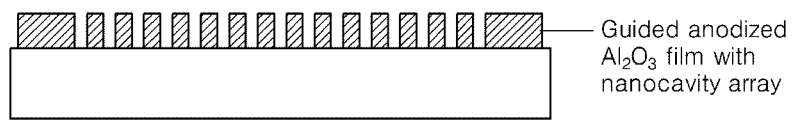
Figure 5C:
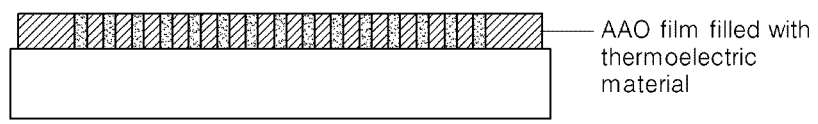
Figure 6A:
FIGS. 6A-6C schematically illustrate an exemplary embodiment of fabrication of an exemplary embodiment of a bulk thermoelectric material comprising a one-dimensional thermoelectric nanowire array.
Figure 6B:
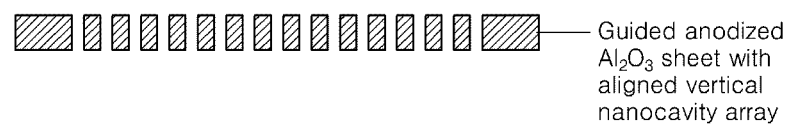
Figure 6C:
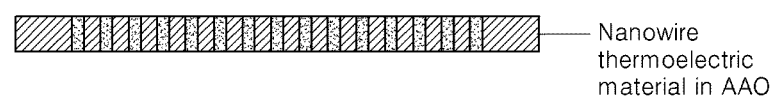

The vertically aligned nanopores so induced are then filled by the TE materials by electrochemical deposition as illustrated in FIGS. 5A-C. For an example, in one exemplary embodiment electrodeposition of alloy material in the vertical nanopores of anodized aluminum oxide ("AAO") may be made on a flat substrate. Exemplary embodiments include configurations wherein instead of thin film or thick film AAO nanopores of FIGS. 5A-C, a bulk aluminum foil can be used to fabricate AAO pores, which can then be filled with a TE alloy by electrodeposition, as illustrated in FIGS. 6A-C.

Figure 7:
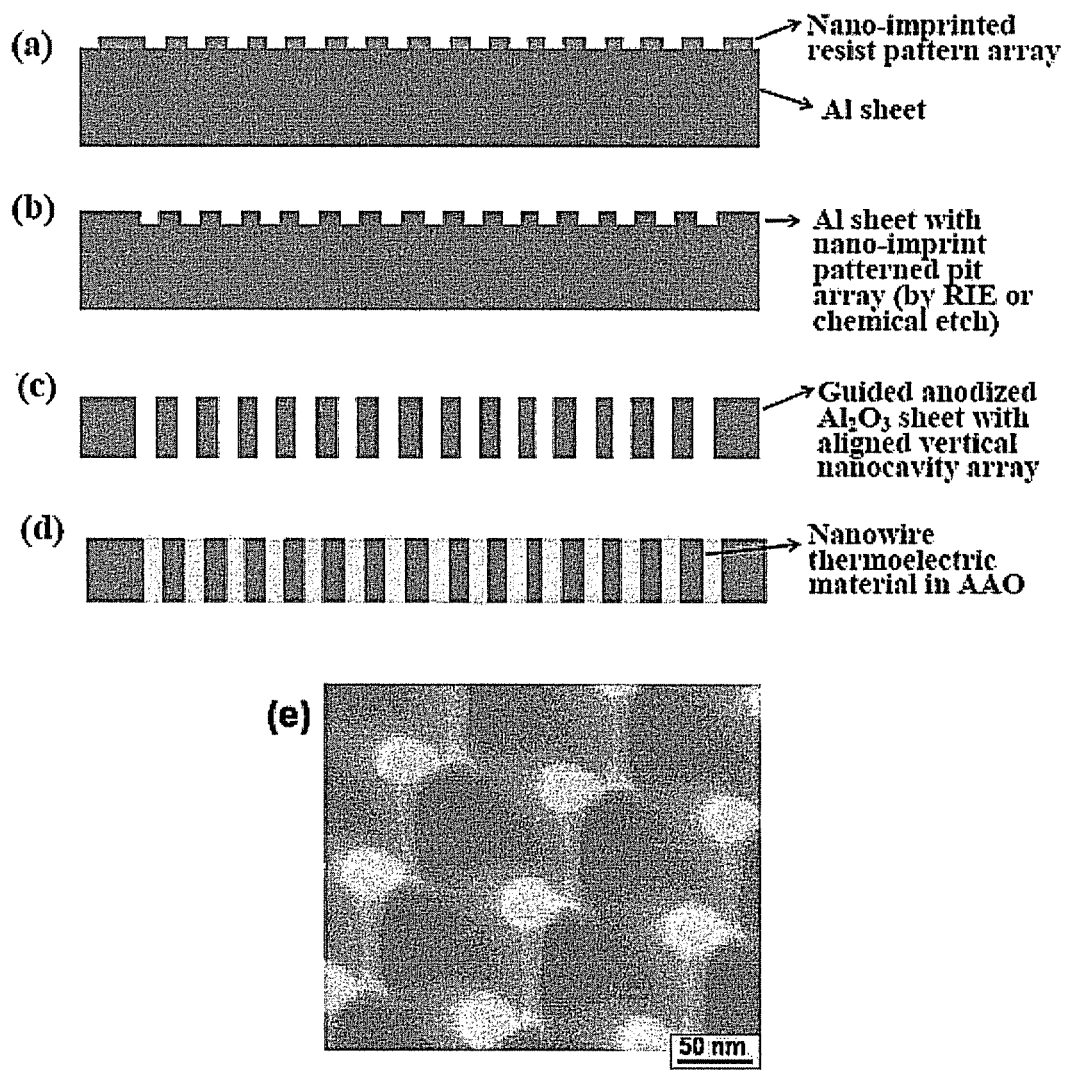
FIG. 7 illustrates an exemplary embodiment of an alternative technique for fabricating sub-10 nm vertical pores according to the present invention.

Another exemplary embodiment of fabricating nanopores aligned along the direction of the elongation in the insulating matrix is to utilize a nano imprinted resist mask as illustrated in FIG. 7. The resist array itself or a reversed pattern of metal film by evaporation deposition and lifted-off process, as used in Si fabrication technology, can be used to apply initial etch pit formation and guided anodization or guided etching. An example nano-mask array of resist islands made of hydrogen silsesquioxane ("HSQ") resist is shown in FIG. 7(e).

Yet another exemplary embodiment of fabricating nanopores aligned along the direction of the elongation in the insulating matrix is to utilize a two-phase decomposable layer, for example, in one exemplary embodiment a diblock copolymer consisting of a mixture of polystyrene-polybutadiene and that of polystyrene-polyisoprene may be used. For a description of the use of an ordered block copolymer structure for nano-island synthesis, see articles by M. Park, et al., "Block Copolymer Lithography: Periodic Arrays of 1011 Holes in 1 Square Centimeter", Science, Vol. 276, page 1402 (1997), and by R. A. Pai et al, "Mesoporous Silicates Prepared Using Preorganized Templates in Supercritical Fluids", Science, Vol. 303, page 507 (2004).

The diblock copolymers are diluted with a solvent, exemplary embodiments of which include toluene, and can be spin coated on a flat substrate, and decomposed into a two-phase structure by heating to about 100° C. to about −250° C., one phase of which can be removed by chemical or reactive ion etching ("RIE") to produce a structure as illustrated in FIG. 7(a).

Referring to FIG. 8, the drawing schematically illustrates an exemplary embodiment of a method of filling such small, sub-10 nm anisotropic nanopores with TE material by electrodeposition. By metallizing one of the two surfaces of the nanopore membrane (wherein the nanopore membrane may be made of porous silica, anodized alumina, anodized zirconia, hafnium oxide, or other similar materials), and allowing free movement of electrolyte along the length of the nanopores, TE materials such as Bi, $Bi_2Te_3$, $Bi_{1-x}Sb_x$ (wherein 0<x<1), $Bi_xSb_{2-x}Te_3$ (wherein 0<x<2), antimonide based skutterudites, and various other materials having similar characteristics can be electroplated to fill the pores and form aligned nanocomposite TE material. Then presence of through holes in the nanoporous membrane is important to allow easy access of electrolytes and easy metal deposition inside the extremely small diameter pores. Alternative exemplary embodiments include configurations wherein supercritical $CO_2$ ($scCO_2$) deposition of the TE materials inside the small pores may be used as the vapor-like characteristics of the $scCO_2$ allows easy penetration of the metal containing $scCO_2$ into the nanopores. The deposited precursor material is then decomposed by heating into desired TE alloys within the vertically aligned nanopores.

FIG. 9 schematically illustrates an exemplary assembly comprising anisotropically nanoporous insulator membrane suitably supported for electrodeposition of TE nanowires. Exemplary embodiments of membrane include vertically aligned through-pores having an average diameter of about 20 nm or less, or in one exemplary embodiment about 5 nm or less. In the present exemplary embodiment, one of the membrane surfaces is sputter-coated, evaporation-coated, or electroless-coated with electrically conductive film to allow electroplating with ease of electrolyte or supercritical $CO_2$ vapor transport through the pores. The support membranes are used to mechanically support the nanoporous membrane material for handling during electrodeposition.

In the present exemplary embodiment, the desired average diameter of the elongated nanopore arrays in the inventive anisotropic TE nanocomposites with the filled nanopores is in the range of about 1 nm to about 100 nm, an in one exemplary embodiment may be from about 1 nm to about 20 nm, or in another exemplary embodiment may be from about 1 nm to about 10 nm, and in another exemplary embodiment may be from about 1 nm to about 5 nm. Exemplary embodiments of the present invention include configurations wherein the overall desired thickness of the anisotropically structured bulk TE materials is typically in the range of about 1 micrometers to about 100,000 micrometers, exemplary embodiments also include configurations wherein the range is about 10 micrometers to about 5,000 micrometers, exemplary embodiments also include configurations wherein the range is about 100 micrometers to about 5000 micrometers.

The TE material, such as $Bi_2Te_3$, $Sb_2Te_3$, $Bi_xSb_{2-x}Te_3$ (wherein 0<x<2), $Bi_2Te_xSe_{3-x}$ (wherein 0<x<3), Pb—Te, $CeFeCoSb_3$, $Ba_3Ni_{0.05}Co_{3.95}Sb_{12}$ is then electroplated into the vertical nanopores of Si oxide to form one-dimensional, laterally confined TE composites. The TE material can be electrodeposited either in the $SiO_2$ vertical nanopored substrate, or electrodeposited into the porous Si first before oxidation, then the (TE+vertically porous Si) nanocomposite is subjected to an oxidizing heat treatment to convert the Si into $SiO_2$ (e.g., by heating to about 300° C.-to about 1000° C. for about 1 hr to about 200 hrs in an oxidizing atmosphere, exemplary embodiments of which include air, $O_2$ gas, or $O_2$+inert gas. In one exemplary embodiment, the oxidizing atmosphere is selected to be below the manufacturing process temperature of the TE material involved, but the invention is not restricted to temperatures below the m.p. of the TE material), followed by re-conversion to metallic TE material by heat treating in a reducing atmosphere such as $H_2$ gas, forming gas ($H_2$+argon or nitrogen), $NH_3$ gas or CO gas, at a temperature of about 300° C. to about 1000° C. for about 1 hr to about 200 hrs. The $SiO_2$ formed during the oxidizing step is stable enough that the subsequent reducing heat treatment for the TE fibers inside the pores will not reduce the $SiO_2$.

A variation of this exemplary embodiment of filling the vertically aligned pores with TE material is to utilize a concentric superlattice structured TE material with thin-wall separation with electrical and thermal nanoporous or non-porous insulating matrix as illustrated in FIGS. 10A-C. Here a pseudo-superlattice configured TE material (having concentric layers instead of planar layers) is inserted into the vertically aligned pores as a thin-wall cylinder configuration. That is, anisotropically elongated, concentrically superlatticed TE nanocomposite comprises multi-layered nanowire structures embedded in a nanoporous insulating matrix, and the multi-layered nanowire structures include multi-layered thin wall cylindrical TE alloy material; and an insulating layer deposited between the multi-layers of the thin wall cylindrical TE alloy material. In one exemplary embodiment the multi-layers of the thin wall cylindrical TE alloy material have at least 3 layers of the thin wall cylindrical TE alloy material. In one exemplary embodiment, each of the cylindrical TE material layer and the insulating layer can have an average thickness of about 0.5 nm to about 2 nm.

In one exemplary embodiment, the multi-layered nanowire structures can be formed by alternating deposition of TE material layer and the insulating layer using chemical vapor deposition, sputtering, or atomic layer deposition ("ALD") techniques.

Referring to FIGS. 10A-C, the drawing schematically illustrates the fabrication of an exemplary embodiment of a nanoscaled and anisotropic bulk TE material by depositing a 2-D circular superlattice configuration inside the anodized aluminum oxide ("AAO") pores, with alternating multilayer deposition of (TE layer+Al layer) using CVD, sputtering, ALD (atomic layer deposition) techniques.

The first step in this exemplary embodiment is to prepare an AAO template, e.g., with relatively easily fabricated about 200 nm diameter vertically aligned pores (in one exemplary embodiment the diameter of the pores may be about 50 nm to about 1000 nm), almost periodically arranged, with a thickness range of about 1 micrometer to about 100,000 micrometers; although alternative exemplary embodiments include thicknesses of about 10 micrometers to about 5,000 micrometers, and additional alternative exemplary embodiments include thicknesses of about 100-micrometers to about 5000 micrometers.

In one exemplary embodiment, a direct alternating multilayer deposition of $[TE+Al_2O_3]_n$ concentric superlattice via RF sputtering can be utilized to fabricate such multilayer superlattice structures with the TE nanolayers separated by electrically and thermally insulating oxide layers. In one exemplary embodiment the number of layers is about 3 layers to about 500 layers, and the thickness of each layer is about 0.5 nm to about 2 nm. Alternative exemplary embodiments include configurations wherein instead of $Al_2O_3$ deposition, a metallic Al layer can be deposited which is then converted to an $Al_2O_3$ layer by an oxidation heat treatment, followed by a reduction heat treatment process to restore the TE material into metallic state. Exemplary embodiments include configurations wherein other insulating materials such as oxides of Ca, Mg, Cr, Ti, Zr, Hf, Nb, Ta, rare earth metals or their alloys, nitrides or fluorides of Si, Al, Ca, Mg, Cr, Ti, Zr, Hf, Nb, Ta, rare earth metals or alloys can also be utilized. In one exemplary embodiment, the amount of the nanoporous insulating matrix is less than about 601% of the volume of the TE nanocomposite, for example in one exemplary embodiment the nanoporous insulating matrix is less than about 30% of the volume of the TE nanocomposite.

Alternative exemplary embodiments include configurations wherein instead of depositing alternating layers of pure TE layer+Al layer into the pore, optionally the TE material can be co-deposited together with second-phase-precipitatable metal or phase (e.g., by off-stoichiometric composition or by co-depositing an oxide-dispersoid-forming element such as Ti, Zr, Al, rare earth metals, and other similar materials.). The formation of second phase particles can be useful for enhancing phonon scattering in the TE material with resultant reduction in thermal conductivity K of the TE material.

In exemplary embodiments wherein metallic interlayers are used, e.g., Al layer deposition (instead of direct $Al_2O_3$ layers deposition) between the TE layers, the Al layers can either naturally oxidize to the desired $Al_2O_3$ layers, or can be oxidation heat treated in an oxidizing atmosphere by heating into about 400° C. 600° C.+reducing atmosphere heat treatment (e.g., using $H_2$, $NH_3$, CO, $H_2$+ inert gas, etc.) so as to reduce any oxidized TE material back to the metallic state. The anisotropically elongated TE nanocomposite obtained by these processes can have an average diameter of less than about 20 nm, and a ZT value of at least 1.5.

Exemplary Embodiment 2: A Uniaxially Deformed TE Nanocomposite Comprising TE Materials Embedded in an Electrically and Thermally Insulating Material Unlike the previous exemplary embodiment, instead of utilizing the pre-nanopored structures like porous silicon or porous alumina to fill the TE materials, an alternative exemplary embodiment disclosed in this invention is to utilize uniaxial plastic deformation to reduce the cross-sectional diameter of the TE material particles or fibers separated by electrically or thermally insulating material, and elongate them to cause anisotropic alignment as well as to reduce the diameter of TE component for one-dimensional confinement.

The volume fraction of the amount of the TE material can be about 30% to about 90%, in one exemplary embodiment it may be about 50% to about 70% with the remaining portion being an insulating material.

The uniaxially deformed TE nanocomposite can have an anisotropically elongated and nanofibered structure. Further, the TE material can have a nanowire structure, and in one exemplary embodiment the average aspect ratio of length to diameter ratio of the TE material can be at least 2, for example in exemplary embodiments it may be at least 5.

The drawing in FIGS. 11A-C schematically illustrate, according to another exemplary embodiment of the invention, elongated and aligned TE metals/alloys assembly structures obtained by uniaxial deformation in an insulator matrix. TE materials can be selected from a group consisting of Si, $Si_{1-x}Ge_x$ (wherein 0<x<1), $Bi_2Te_3$, $Sb_2Te_3$, $Bi_xSb_{2-x}Te_3$ (wherein 0<x<2), $Bi_2Te_xSe_{3-x}$ (wherein 0<x<3), $B_4C$/$B_9C$, BiSb alloys, and PbTe, Mg—Si, Mg—Ge, Mg—Sn or their ternary systems, binary, tertiary or quaternary skutterudites (e.g., $CeFeCoSb_3$, $Ba_3Ni_{0.05}Co_{3.95}Sb_{12}$), and Lead-Antimony-Silver-Tellurium Pb—Sb—Ag—Te ("LAST") TE alloys. While more ductile alloy systems may be used for this processing approach than in the previous exemplary embodiment, the use of brittle materials such as Si, Ge, carbide base compounds are not excluded since they can be pulverized into nanostructures although they may not elongate as much by the uniaxial deformation utilized.

Metallic TE particles of $Bi_2Te_3$, $Sb_2Te_3$, $BixSb_{2-x}Te_3$ (wherein 0<x<2), $Bi_2Te_xSe_{3-x}$ (wherein 0<x<3), BiSb alloys, and PbTe, skutterudites, and LAST alloys are mixed with nano- or micro particles of electrical or thermal insulator particles such as oxide, nitride or fluoride particles to separate the TE material and eventually form elongated, anisotropic TE fibers by uniaxial deformation. The repeated passes of uniaxial plastic deformation (such as swaging, rod drawing, extrusion, or wire drawing with optional combination with planar cold or warm rolling) progressively reduce the rod diameter and at the same time elongate the TE alloy particles for the ductile alloy types. The insulator nanoparticles, however, are brittle, and they get pulverized to even finer particle size during the uniaxial deformation and redistributed as a fine nanoparticle matrix within which the elongated TE nanofibers are embedded.

The fabrication process steps to obtain sub-10 nm aligned TE nanowire structures are (a) preparing a composite preform consisting of TE materials, e.g., in one exemplary embodiment powders, and electrical and thermal insulator particles, and placing and packing them inside a metal tube; b) sealing the packed metal tube and applying a uniaxial deformation to reduce the diameter and elongate the metal jacket into rod form; (c) repeating the steps (a) and (b) for a plurality of composite preforms; and (d) after rebundling the uniaxially deformed, diameter-reduced rods and placing them in another larger metal tube, applying further uniaxial deformation to obtain a uniaxially deformed TE nanocomposite, with an optional consolidating anneal at about 200° C.-to about 800° C. to relieve stress and ensure desirable recrystallized structure.

The specific fabrication process steps will be explained below.

<Step 1> The first step of the process is to prepare a composite preform consisting of TE metal or alloy powders and the insulating material, for example, oxide powders separating the TE metal or alloy powders inside a metal jacket. The TE powders can be selected from a group of materials such as Si, $Si_{1-x}Ge_x$ (wherein 0<x<1), $Bi_2Te_3$, $Sb_2Te_3$, $Bi_xSb_{2-x}Te_3$ (wherein 0<x<2), $Bi_2Te_xSe_{3-x}$ (wherein 0<x<3), $B_4C/B_9C$, BiSb alloys, and PbTe, Mg—Si, Mg—Ge, Mg—Sn or their ternary systems, binary, tertiary or quaternary skutterudites (e.g., $CeFeCoSb_3$, $Ba_3Ni_{0.05}CO_{3.95}Sb_{12}$), and Lead-Antimony-Silver-Tellurium Pb—Sb—Ag—Te ("LAST") TE alloys. In one exemplary embodiment, the particle or fiber diameter of the TE metal or alloy powders is in the range of about 5 nm to about 50,000 nm, and in one exemplary embodiment the range is about 100 nm to about 2,000 nm.

These TE metal or alloy powders, fibers, wires, alloy- or elemental-mix granules are then mixed with nano- or micro particles of electrical and thermal insulators (for example, exemplary embodiments include oxide, nitride or fluoride nanoparticles such as $SiO_2$, $Al_2O_3$, or oxides of Ca, Mg, Cr, Ti, Zr, Hf, Nb, Ta, rare earth metals or their alloys, nitrides or fluorides of Si, Al, Ca, Mg, Cr, Ti, Zr, Hf, Nb, Ta, rare earth metals or alloys thereof). Exemplary embodiments of the insulator nanoparticle size is in the range of about 2 nm to about 1,000 nm, and in some exemplary embodiments in the range of about 5 nm to about 100 nm. In one exemplary embodiment, the volume fraction of the amount of the oxide used (e.g., $Al_2O_3$) in the preparation of the composite nanostructure is in the range about 10% to about 70%, and in one exemplary embodiment is in the range of about 30%-to about 50%. These mixed particles are placed inside a metal or alloy jacket (e.g., a jacket material made of Cu, Ag, Fe, and their alloys, stainless steel, Sn, Bi, Sb, Bi—Sn alloys) as illustrated in FIG. 11A and packed well with a plunger or a cylindrical press die or other similar instrument.

<Step 2> The packed metal jacket is then sealed by folding the ends and crimping, with an optional use of inert gas or vacuum atmosphere. Uniaxial deformation such as swaging, wire drawing, extrusion, or rolling is then applied to reduce the diameter and elongate the rod into wire form. Exemplary embodiments include configurations wherein the deformation can be carried out either at room temperature or at high temperature (e.g., about 100° C.-to about 600° C.) where the TE material becomes softer and easier to mechanically deform/elongate especially if the temperature is close to the melting point of the TE material. As a result repeating such deformation, elongated and aligned TE metal or alloy fibers are formed in insulator particle matrix, as shown in FIG. 11B. The TE material can be either in solid or liquid or mixed state during deformation.

<Step 3> After rebundling the uniaxially deformed, diameter-reduced rods obtained by repeating steps 1 and 2 on a plurality of composite preforms, placing them in another larger metal jacket, and continued deformation, very fine, nanoscale fibrous structures are obtained. An optional consolidating anneal at about 200° C. to about 800° C. may be provided to relieve stress and ensure desirable crystal structure.

<Step 4> When the desired, small-diameter TE nanocomposite are obtained by repeated uniaxial deformation and optional consolidating annealing treatment, perpendicular slicing of the TE composite rod is performed to prepare thin wafers (e.g., in one exemplary embodiment a few micrometer to a few millimeters thick) for insertion into TE devices for energy or temperature transfer.

Instead of using the insulating oxide, nitride or fluoride nanoparticle to surround the TE particles, exemplary embodiments include configurations wherein metallic particles or metallic coating can alternatively used for ease of uniaxial elongation. The TE microparticles or nanoparticles are mixed with clean (minimal surface oxidation) nanoparticles of oxidizable metals or alloys such as Al, Ti, Zr, Hf, Nb, Ta and their alloys, and placed in the metal jacket for uniaxial deformation, similarly as in the drawing of FIGS. 11A-C, except that the oxide particles discussed in the embodiment related to FIGS. 11A-C are now replaced with metal particles as illustrated in FIGS. 15A, 15C and 15D. After the diameter-reducing uniaxial deformation, the elongated and partially fused metal particles which surround the elongated TE nanofibers are converted into an oxide layer, either by natural oxidation in air or by providing an oxidizing heat treatment at about 100° C. to about 600° C., either before or after perpendicular slicing like the process in FIG. 11C or FIG. 15D.

A variation of this exemplary embodiment is the use of surface coating of the TE particles with metal, as illustrated in FIGS. 15B, 15C and 15D. The metal coating of the TE particles is also convenient in that a ductile metal or alloy is elongated together with the TE material during the uniaxial deformation, relatively effectively maintaining the separation of the resultant TE nanofibers from neighboring TE nanofibers. In one exemplary embodiment, the metal particle size is in the range of about 2 nm to about 1,000 nm, and in some exemplary embodiments is in the range of about 5 nm to about 100 nm. In one exemplary embodiment, the volume fraction of the amount of the metal used (e.g., Al) in the preparation of the composite nanostructure is in the range of about 10% to about 70%, and in some exemplary embodiments is in the range of about 30% to about 50%. The elongated and thinned metal, e.g., Al coating, can easily be converted later into a oxide insulator form by either natural oxidation of thin Al into $Al_2O_3$, or by annealing heat treatment (e.g., at about 100° C.-to about 600° C.) in an oxygen-containing atmosphere. The use of a combination of metal coating and metal particle mixing is not excluded, for example, in one exemplary embodiment 20% volume fraction of the composite material may be composed of the metal for coating of the TE particles and 30% volume fraction may be composed of the metal particles mixed with these coated TE particles.

Figure 12:
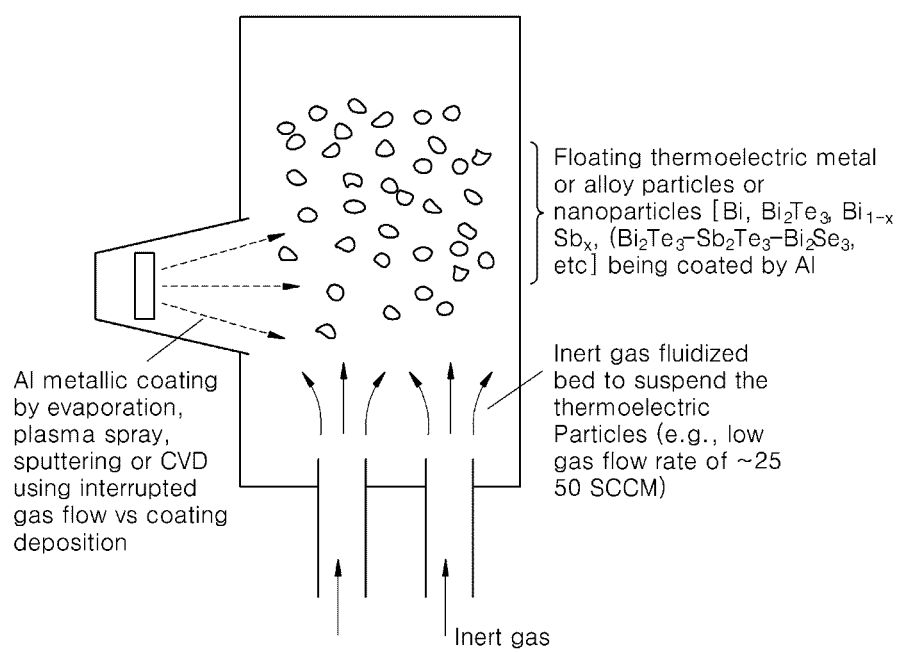
FIGS. 12-14 schematically illustrate additional exemplary embodiments of procedures for preparation of Al metal coated thermoelectric particles according to the present invention.
Figure 13:
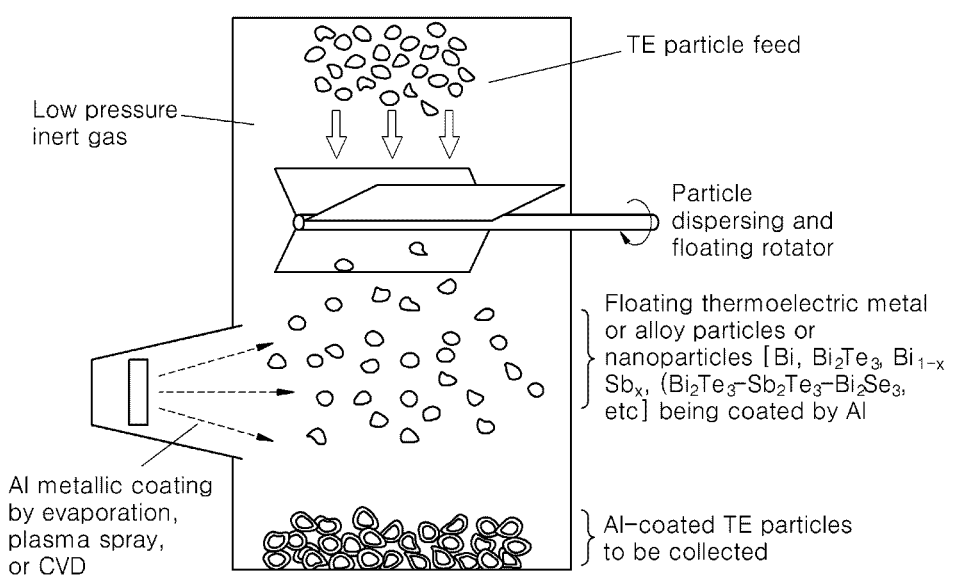
Figure 14:
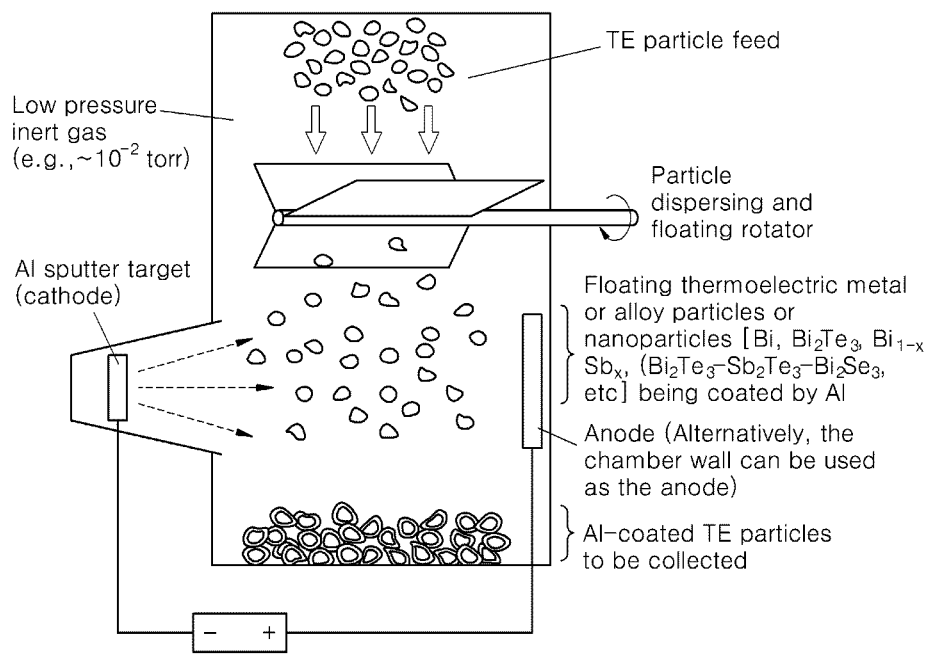

The coating of the TE particles with oxidizable metal such as metallic aluminum (Al) can be accomplished using a variety of techniques. FIGS. 12-14 schematically illustrate an exemplary embodiment of a method for preparation of Al-metal-coated TE particles using fluidized bed processing, evaporation, sputtering, chemical vapor deposition ("CVD") and plasma spray approaches.

In FIG. 12, an inert gas fluidized bed process is utilized to suspend the TE particles while the Al deposition is carried out. In one exemplary embodiment the TE particle size is in the range of about 20 nm to about 10,000 nm, and in some exemplary embodiments is from about 50 nm to about 1000 nm. In one exemplary embodiment, the gas flow rate is in the range of about 20 SCCM (standard cubic centimeter per minute) to about 200 SCCM, and in some exemplary embodiments the lower flow rate regime of about 25 SCCM to about 50 SCCM may be used so that the evaporation or sputtering can be carried out without too much collision with background gas molecules.

The TE particles such as $Bi_2Te_3$, $Sb_2Te_3$, $Bi_xSb_{2-x}Te_3$, $Bi_2Te_xSe_{3-x}$, PbTe, binary, tertiary or quaternary skutterudites (e.g., $CeFeCoSb_3$, $Ba_3Ni_{0.05}Co_{3.95}Sb_{12}$), Lead-Antimony-Silver-Tellurium Pb—Sb—Ag—Te ("LAST") TE alloys, and related compounds, can be used for Al coating. The particles are coated with Al while being suspended, using evaporation, plasma spray, sputtering or CVD deposition techniques as illustrated in FIG. 12. In FIG. 13, the suspension of TE particles is enhanced by a rotating or laterally moving blade which shakes up and disperses the TE particles fed from the top by gravity for longer time suspension while the Al-deposition is being conducted. In FIG. 14, Al metal sputtering cathode and anode arrangements are illustrated. Exemplary embodiments include configurations wherein either a separate anode or the chamber wall itself can be used as the anode.

As illustrated in FIG. 15, when the Al-particle-separated or Al-layer-coated TE particles are prepared, they are placed in a metal jacket (e.g., made of Cu, Ag, Fe, stainless steel, Sn, Bi, Sb, Bi—Sn alloy), as illustrated in FIGS. 15A-B for uniaxial deformation using swaging, wire drawing, rod rolling, etc. FIG. 15C in combination with rolling deformation if desired so as to utilize plastic deformation to reduce the diameter of the TE particles to below about 10 nm, and in one exemplary embodiment below about 5 nm. Ductile TE particles will plastically deform and elongate during the uniaxial deformation, while more brittle TE particles will fragment into smaller-diameter particles. A mixture of such configurations arises when the TE material involved has a limited ductility with intermediate mechanical properties. It should be noted that in this invention, the uniaxial deformation can be carried out at a high temperature at which the TE material becomes substantially more ductile, and even becomes a fluid near or above the melting temperature. Thus, the TE material can be either in solid or liquid or mixed state during deformation (by heating) for ease of plastic deformation at lower applied stress levels.

The plastically deformed and diameter-reduced materials can be rebundled, placed in a fresh metal jacket for continued deformation to further diameter-reduced, nanoscale fibrous structures. An optional consolidating anneal at about 200° C. to about 800° C. may be provided during the process of repeated swaging, wire drawing and other deformation processes to relieve stress and ensure desirable crystal structure.

After the desired degree of plastic deformation/rebundling/annealing treatments is given to the TE composite rod, an oxidation/reduction heat treatment cycle is applied as described earlier. The oxidation treatment can be applied either in the metal jacketed state or partially sliced state as illustrated in FIG. 15D. The metal jacket can be optionally removed at this stage to make the diffusion of $O_2$ or $H_2$ molecules easier for enhanced oxidation of Al or reduction of TE elements. The final rod with nanostructured elongated and anisotropic TE elements with less than about 5 nm diameter, physically separated by electrically and thermally insulating $Al_2O_3$ layers can then be sliced perpendicular to the rod axis, as shown in FIG. 15D, so that thin or thick wafers (e.g., a few micrometer to a few millimeters thick) with anisotropic nanostructure and desirable vertical TE properties can be produced for use as a component of TE devices for energy or temperature transfer. Alternative exemplary embodiments include configurations wherein the oxidizable metal layer (such as Al originally provided as Al-coating and/or Al particles in FIG. 15(a), can be oxidized after the jacket is removed and the nanocomposite rod is sliced to the device thickness, e.g., in one exemplary embodiment about 1 mm to about 5 mm in thickness, and reshaped if desired, for example, into a square cross-sectional geometry instead of the round geometry.

If the degree of oxidation treatment is optimized, the TE material embedded in the insulating matrix (e.g., solid or nano-powder aggregate $Al_2O_3$) can be maintained in a metallic state without noticeable oxidation. However, in exemplary embodiment wherein the TE material also gets oxidized partially or fully (e.g., bismuth telluride compound becoming bismuth telluride oxide), a reduction treatment is applied in order to restore the metallic TE alloy status. In one exemplary embodiment, the reduction heat treatment can be carried out typically at about 200° C.-to about 800° C. (in one exemplary embodiment at a temperature below the melting point of the TE material) for about 0.1 hr to about 100 hrs, using reducing gas atmosphere such as $H_2$ gas, ($H_2+N_2$) forming gas, $NH_3$ gas, CO gas or a mixture with an inert gas.

The oxidizing as well as reducing heat treatment is carried out below the melting point of metals or alloys involved as the melting point of Al is 660° C. while that of the bismuth telluride ($Bi_2Te_3$) is 573° C. and that of antimony telluride is 620° C. The aluminum oxide is very stable, and will remain as oxide during the hydrogen atmosphere reducing heat treatment. The TE materials containing highly oxidizeable elements such Mg, Ce, Si, if oxidized, are more difficult to reduce back to metallic state by a simple $H_2$ atmosphere annealing.

In one exemplary embodiment, the average diameter of the elongated TE filaments in the plastically deformed and sliced nanocomposites is in the range of about 1 nm to about 100 nm, and in one exemplary embodiment is in a range of about 1 nm to about 20 nm, or in one exemplary embodiment may be in a range of about 1 nm to about 10 nm. The overall thickness of the anisotropically structured bulk TE materials in this invention, after slicing as in FIG. 15D, is typically in the range of about 100 micrometers to about 100,000 micrometers, and in one exemplary embodiment may be in the range of about 100 micrometers to about 5,000 micrometers.

Instead of roughly round particles, a pre-elongated TE material can be utilized as illustrated in FIGS. 16A-C if acicular or needle-shape TE powders are employed. These powders are mixed with insulating oxide particles, or oxidizable metal particles (or coated with an oxidizable metal such as Al), placed in a metal jacket, and subjected to diameter-reducing uniaxial deformation similarly as in earlier embodiments.

An exemplary embodiment of how to prepare such pre-elongated TE powder according to the present invention is described in FIGS. 17A-D. TE material can be electrodeposited into anodized aluminum oxide (AAO) by well known processes. The fabrication of AAO templates with about 100 nm to about 500 nm diameter, nearly periodic pores is relatively easy. The vertical pores are electrolytically filled with TE materials such as $Bi_2Te_3$, $Sb_2Te_3$, $Bi_xSb_{2-x}Te_3$ (wherein 0<x<2), $Bi_2Te_xSe_{3-x}$ (wherein 0<x<3), or Pb—Te. Electrochemical filling process of AAO pores is well established. The aluminum oxide matrix is then dissolved away by chemical etching with NaOH or KOH to release the nanowires of $Bi_2Te_3$, $Sb_2Te_3$, $Bi_2Te_xSe_{3-x}$ (wherein 0<x<3), Pb—Te, which can then be Al metal coated by using a special process in a fluidized bed or sputtering chamber as illustrated in FIGS. 12-14. These nanofibers of TE material are then collected and placed in a metal jacket and a diameter-reducing plastic deformation is applied, the Al coating layer is converted to desired $Al_2O_3$ state by oxygen atmosphere annealing (the metal jacket can be removed at this stage if desired), and the TE material is then restored to a metallic state (if needed) by reducing atmosphere heat treatment similarly as described above.

Figure 20:
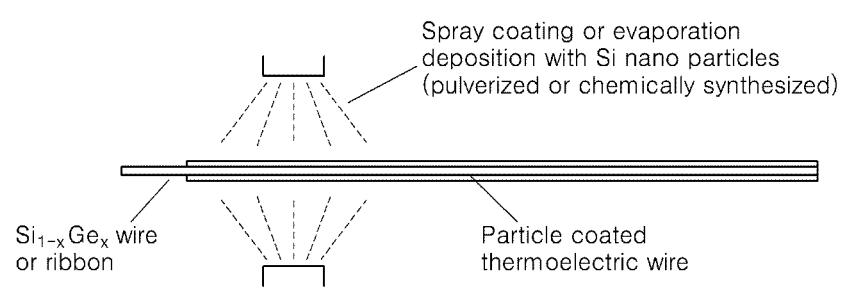
FIG. 20 illustrates an exemplary embodiment of a process of coating of thermoelectric precursor material wires or ribbons with matching thermoelectric elements to form a composite.

Solid TE metal rods, wires, ribbons may alternatively be utilized, instead of the powder shape TE material, as illustrated in FIG. 18. Yet another alternative exemplary embodiment uses a laminated perform of BiTe, Bi/Sb, Si/Si—Ge or $B_4C/B_9C$ for fabrication of elongated TE nanocomposites by deformation, as illustrated in FIG. 19. For preparation of laminated preform, various processes such as spray coating (see FIG. 20), dip coating, spin coating, etc can be utilized.

Figure 21A:
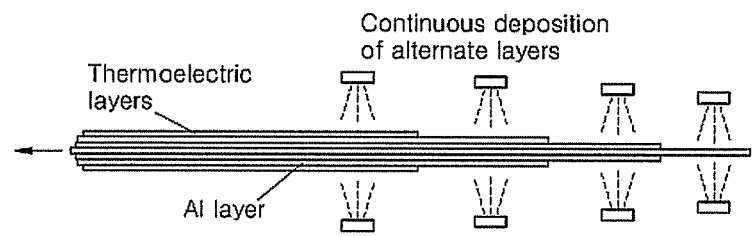
FIGS. 21A-21C illustrate another exemplary embodiments of a method of fabricating nanoscale bulk anisotropic TE materials according to the present invention.
Figure 21B:
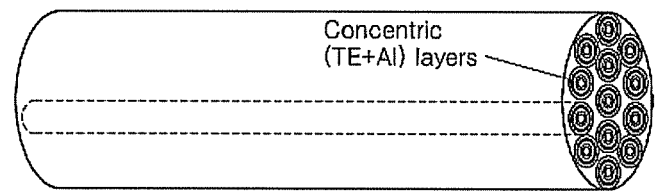
Figure 21C:
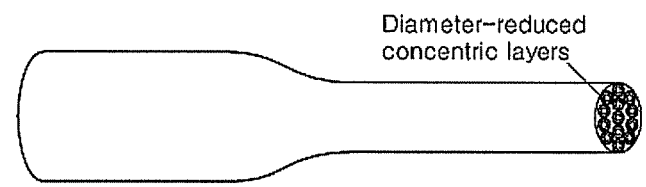

Using continuous evaporation deposition of TE alloy layers and Al metal layers, a different configuration of perform composite can be fabricated as illustrated in FIG. 21. The multilayer-coated fibers are then bundled and placed in a metal jacket, and are subjected to diameter-reducing plastic deformation to reduce the TE layer thickness below the about 5 nm regime. Because of all metallic composite, the uniaxial plastic deformation such as swaging or wire drawing (either at room temperature or high temperature for easier deformation) can relatively easily reduce the TE dimensions to the nanoscale regime, and also make the TE elements elongated along the desired length direction. Once the dimension of the TE elements is reduced to desired range, the material is subjected to oxidation/reduction annealing cycle as described above. The metal jacket can be removed or the rod can be sliced into device thickness if desired in order to expose the TE composite material and enhance $O_2$ or $H_2$ gas molecule diffusion for more efficient oxidation or reduction heat treatment, and to produce anisotropic TE nanolayer arrays physically well separated by electrically and thermally insulating aluminum oxide material.

As a consequence of the diameter-reducing uniaxial deformation that involves significant amount of plastic and elastic deformation on the TE material, some inherent microstructural alterations are created in addition to the geometrical one-dimensional confinement. The abrasive friction of the elongating TE material nanofibers with adjacent matrix oxide particles, and mechanical intermingling of nanofibers with some of the adjacent oxide particles (or oxidizable metal particles) introduces defects on the surface of the TE nanofibers, illustrated in FIG. 22A, and also causes internally pushed-in oxide or metallic nanoparticle defects within the TE nanofibers as shown in FIG. 22B. These defects are considered beneficial as they serve as phonon scattering centers to significantly reduce the thermal conductivity of the TE material, which results in a substantial improved figure of merit, ZT. The diameter-reducing uniaxial deformation, because of the severe plastic deformation involved and lateral confinement in resultant nanofibers, also introduces grain refinement of the TE phase with many grain boundaries, point defects, dislocations, twin boundaries, etc., which also are beneficial for improved ZT.

Therefore, the invention related to the diameter-reducing uniaxial deformation (as described herein with respect to exemplary embodiment 2) includes not only convenient and novel, anisotropic elongated geometries, but also a creation of new, phonon-scattering-enhanced nanostructures. The invented elongated nanocomposite structure is represented as an increased aspect ratio (the average length to diameter ratio) of the TE phase of at least 2, and in some exemplary embodiments by at least 5, or in other exemplary embodiments by at least 10. Exemplary embodiments of the average diameter of the nanocomposite are in the range of about 1 nm to about 100 nm, in some other exemplary embodiments from about 1 nm to about 20 nm, and in other exemplary embodiments from about 1 nm to about 10 nm.

The surface defects and roughness can be represented as an increased surface area of the TE phase. In the invented structure, the TE materials surface area is enhanced (as shown in FIG. 22A), as compared to the similar nanofiber geometry with smooth surface, with the phonon-scattering surface roughness increase of at least 20% larger surface area, and in some exemplary embodiments by about 50%, and in other exemplary embodiments by about 100%. The incorporation of pushed-in foreign nanoparticles in FIG. 22B can be represented as a volume fraction of these phonon-scattering incorporated particles increasing by at least 1%, and in some exemplary embodiments by at least about 3%, and in some exemplary embodiments by at least about 6%. The structure of the TE nanofibers produced by the inventive diameter-reducing uniaxial deformation of nanocomposites consists of ultra fine grains, with the average grain diameter of less than about 200 nm, and in some exemplary embodiments by less than about 100 nm, and in some exemplary embodiments by less than about 50 nm. The grain boundaries serve as phonon scattering center and reduce thermal conductivity significantly. See a paper by J. E. Graebner, et al, "Large Anisotropic Thermal Conductivity in Synthetic Diamond Films", Nature 359, 401 (1992).

Figure 23:
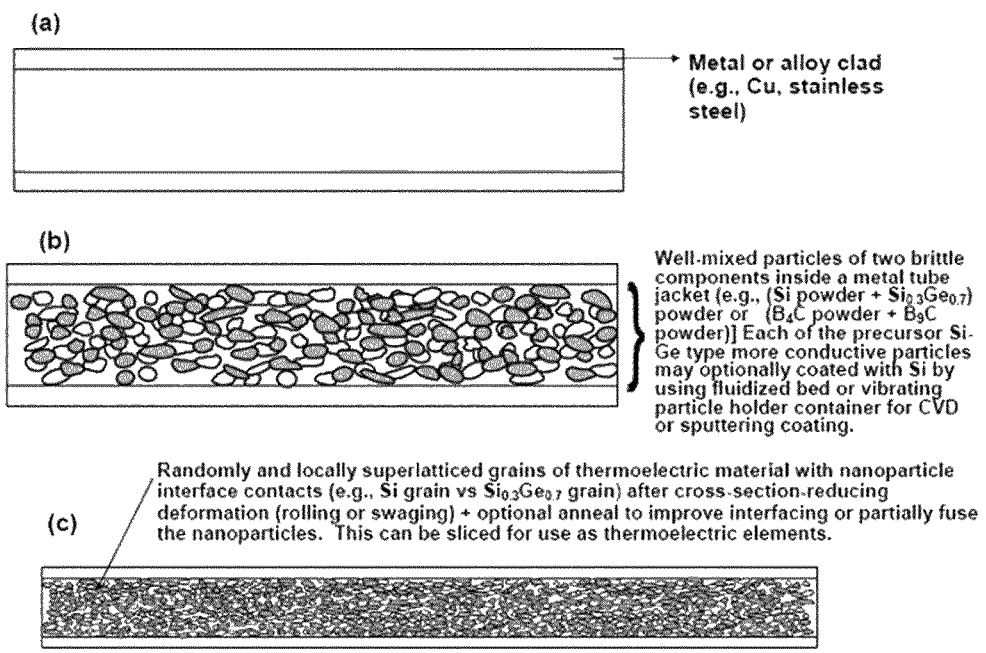
FIG. 23 illustrates yet another exemplary embodiment of randomly and locally superlatticed thermoelectric composites by dimension-reducing deformation of well-mixed particles of two brittle components inside a metal jacket according to the present invention.

Exemplary Embodiment 3: Randomly and Locally Superlatticed TE Nanocomposites by Dimension-Reducing Deformation of Well-Mixed Particles of Two Brittle Components Inside a Metal Jacket FIG. 23 shows yet another exemplary embodiment of the invention, which describes randomly and locally superlatticed TE nanocomposites by dimension-reducing deformation of well-mixed particles of two brittle components inside a metal jacket. Well-mixed particles of two brittle components inside a metal jacket, e.g., (Si powder+$Si_{0.3}Ge_{0.7}$ powder) or ($B_4C$ powder+$B_9C$ powder) are placed inside a metal or alloy jacket (e.g., Cu, stainless steel) and subjected to swaging or cold roll deformation. The particles get pulverized during the deformation (with repeated passes of swaging or rolling into progressively smaller gaps) into smaller and smaller sizes. Optionally, each of the precursor Since $Si_{0.3}Ge_{0.7}$ (or $Si_{1-x}Ge_x$ in general) particles are typically more electrically conductive than Si, and electrical conduction along the path of minimal resistance is short cut to make sure the electrical current paths includes both Si and $Si_{1-x}Ge_x$ particles. Therefore, each of the precursor particles of $Si_{1-x}Ge_x$ may optionally be coated with Si by using fluidized bed or vibrating particle holder container for CVD or sputtering coating prior to mixing, compacting, and perform loading into the jacket for deformation and size reduction.

When the particles are broken up into nanometer sized particles, and then partially fused with neighboring grains on brief, post-deformation annealing, the Si grains and adjacent $Si_{0.3}Ge_{0.7}$ grains with the interfaces or grain boundaries between them are like a local superlattice with the interface serving as the site for enhanced phonon scattering. Such interfaces are frequently crossed as the TE current passes through the material. For the sake of convenience, we refer such grain-grain contacts as randomly and locally superlatticed grains of TE material.

The rod or ribbon (if swaged+rolled) of FIG. 23 can then be sliced into a thin wafer geometry, similarly as in the case of FIGS. 11A-C and 15A-D for assembly into TE devices.

Exemplary embodiments of the average diameter of the elongated nanoscale TE fibers obtained by uniaxial deformation is in the range of about 1 nm to about 100 nm, and in some exemplary embodiments may be about 1 nm to about 20 nm, and in some exemplary embodiments may be about 1 nm to about 10 nm. The overall desired thickness of the sliced wafers with anisotropically aligned TE materials is typically in the range of about 10 micrometers to about 100,000 micrometers, and in some exemplary embodiments in the range of about 100 micrometers to about 5,000 micrometers.

The above-described exemplary embodiments, including new TE materials, structures, configurations, and new methods of fabrication and assembly can be useful for a variety of energy related applications, e.g., solar energy conversion to electricity using the temperature differential between hot sunny regions and cool, shady regions, compact and efficient power sources using nano-structured and nano-engineered TE materials both for civilian portable devices and for deployment in the field for military applications. Heat sinking in electronic circuits, devices, computers, energy conversion of automobile exhaust gas back to electrical energy, efficient refrigerator systems, integrated micro-combustion systems with TE modules for high density power sources, room temperature power supply based on local temperature variations in ambient temperature environment, medical devices such as pacemakers and hearing aid batteries utilizing differential temperatures in the human body etc. are some of the potential applications of the invention materials, processes and devices.

The TE effect refers to the phenomenon of conversion of temperature differential into electric voltage or vice versa. Therefore, a TE device creates a voltage when there is a different temperature on each side of the device thus generating electricity, or creates a temperature difference when a voltage is applied to it so as to cool or heat objects. These effects involve the well-known Seebeck effect, the Peltier effect, and the Thomson effect. By means of these effects, the TE module can be applicable in the waste heat power generation and the electric active cooling without gas compression.

According to another exemplary embodiment, an exemplary embodiment of a thermoelectric element may be prepared by cutting and processing the thermoelectric nanocomposite.

Exemplary embodiments of the thermoelectric element may be a p-type or an n-type thermoelectric element. The thermoelectric nanocomposite may be processed, for example in one exemplary embodiment, in a rectangular parallelepiped shape to form the thermoelectric element.

Meanwhile, a thermoelectric device may be a device having cooling effects by using a current supply or a device having power generation effects using a temperature difference.

Figure 24:
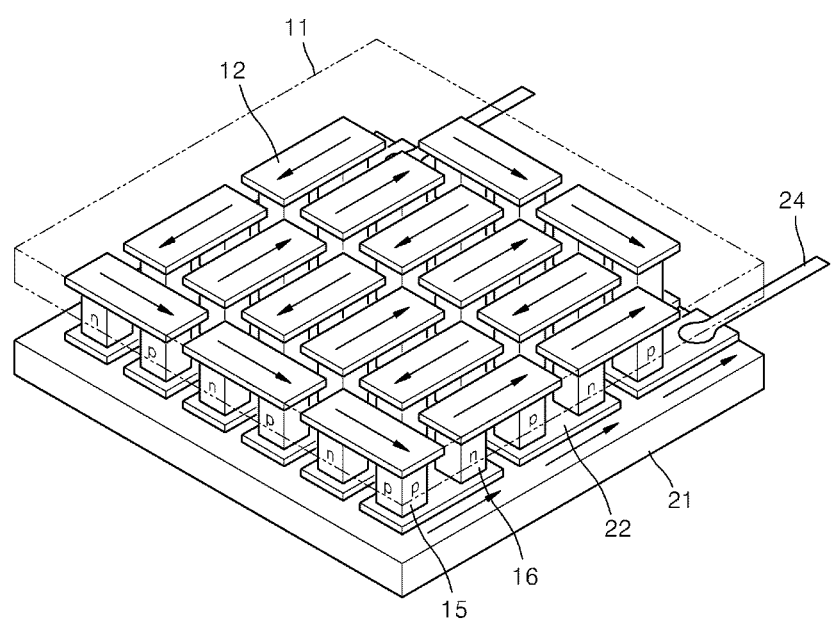
FIG. 24 illustrates an exemplary embodiment of a thermoelectric device.

FIG. 24 illustrates an exemplary embodiment of a thermoelectric module using the exemplary embodiment of a thermoelectric element. As shown in FIG. 24, an upper electrode 12 and a lower electrode 22 are respectively patterned on an upper insulating substrate 11 (shown in a dotted-line for ease of viewing) and a lower insulating substrate 21. A p-type thermoelectric element 15 and an n-type thermoelectric element 16 are in contact with the upper electrode 12 and the lower electrode 22. The upper and lower electrodes 12 and 22 are connected to the exterior of the device via a lead electrode 24.

Exemplary embodiments also include thermoelectric devices. One such exemplary embodiment of a thermoelectric device includes; a first electrode, a second electrode, and the thermoelectric element disposed between the first electrode and the second electrode. In one exemplary embodiment, a thermoelectric device further includes an insulating substrate on which one of the first electrode and the second electrode is disposed, similar to the configuration illustrated in FIG. 24. In one exemplary embodiment, one of the first electrode and the second electrode is configured to be exposed to a heat source.

In one exemplary embodiment of a thermoelectric device, one of the first electrode and the second electrode is coupled to a power source.

In one exemplary embodiment of a thermoelectric device a p-type thermoelectric element and a n-type thermoelectric element are alternately arranged, and at least one of the p-type thermoelectric element and the n-type thermoelectric element include the thermoelectric nanocomposite, similar to the configuration illustrated in FIG. 8.

Exemplary embodiments also include an apparatus including; a heat source, and a thermoelectric device including; a first electrode which absorbs heat from the heat source, a second electrode disposed substantially opposite the first electrode, and the thermoelectric nanocomposite. Exemplary embodiments of the apparatus include configurations further including a power source electrically connected to the second electrode. Exemplary embodiments of the apparatus include configurations further including an electric device electrically connected to the second electrode and which one of consumes and stores power.

Exemplary embodiments of the upper and lower insulating substrates 11 and 21 may include a GaAs, sapphire, silicon, Pyrex, or quartz substrate. Exemplary embodiments of the upper and lower electrodes 12 and 22 may be formed of Al, Ni, Au, Ti, or other similar materials. The size of the upper and lower electrodes 12 and 22 are not limited. The upper and lower electrodes 12 and 22 may be patterned using a known method, for example, in one exemplary embodiment a lift-off process for semiconductor fabrication, deposition, or photolithography, or a combination thereof, may be employed.

As described above, the thermoelectric module may be a thermoelectric cooling system and/or a thermoelectric power generation system. The thermoelectric cooling system may be a micro cooling system, a universal cooling device, an air conditioner, and/or a waste heat recovery system, but is not limited thereto. The configuration of the thermoelectric cooling system and a method of preparing the thermoelectric cooling system are well known in the art, and thus will not be described herein.

Hereinafter, the present invention will be described more specifically with reference to the following examples. The following examples are for illustrative purposes only and are not intended to limit the scope of the invention.

Example 1

$Bi_{0.5}Sb_{1.5}Te_3$ TE alloy powder, having about 40 μm average diameter, is compacted into a copper jacket with a diameter of 0.375". Both ends of the tube are sealed by swaging with smaller diameter dies. The Cu jacket containing TE material is swaged using a series of swaging dies to reduce the tube diameter to 0.080". The Cu jacket material is dissolved by ferric chloride solution, and the collected TE wires are bundled and re-inserted into a new Cu jacket of 0.375 inch diameter, followed by additional swaging to reduce the diameter to 0.080". This process is repeated 8 times and the diameter of the elongated Bi—Sb—Te grain is then reduced to less than about 5 nm. The thermal conductivity of so-prepared Bi—Sb—Te TE material is reduced by a factor of 3. The TE figure of merit ZT at room temperature is increased from about 1.0 to about 2.0.

Example 2

$Bi_2Te_3$ TE alloy powder, having about 10 μm average diameter, is compacted into a brass jacket with a diameter of 0.375". Both ends of the tube are sealed by swaging with smaller diameter dies. The brass jacket containing TE material is swaged using a series of swaging dies to reduce the tube diameter to 0.080". The brass jacket material is dissolved by acid solution, and the collected TE wires are bundled and re-inserted into a new brass jacket of 1 inch diameter. The composite is extruded at 400° C. by rapidly heating the brass tube containing the TE powder, followed by uniaxial extrusion additional swaging to reduce the diameter to 0.100". This process is repeated 5 times and the diameter of the elongated Bi—Te grains is then reduced to less than about 2 nm. The TE figure of merit ZT at room temperature is improved to 1.6.

Example 3

A quarternary skutterudite TE alloy, $Ba_3Ni_{0.05}Co_{3.95}Sb_{12}$, is ground into a fine powder dimension of 20 μm average diameter by attrition milling. The powder is compacted into a copper jacket with a diameter of 0.375". Both ends of the tube are sealed by inserting a copper rod that fits into the inside diameter of the copper tubing. The Cu jacket containing TE material is swaged using a series of swaging dies to reduce the tube diameter to 0.080". The Cu jacket material is dissolved by ferric chloride solution, and the collected TE wires are bundled and re-inserted into a new Cu jacket of 0.375 inch diameter, followed by additional swaging to reduce the diameter to 0.080". This process is repeated 8 times and the diameter of the elongated Bi—Sb—Te grain is then reduced to less than about 3 nm. The thermal conductivity of so-prepared skutterudite TE alloy is reduced at least by a factor of 2. The TE figure of merit ZT at room temperature is 1.5.

It is understood that the above-described embodiments are illustrative of only a few of the many possible specific embodiments which can represent applications of the invention. Numerous and varied other arrangements can be made by those skilled in the art without departing from the spirit and scope of the invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An anisotropically elongated thermoelectric nanocomposite comprising:
a plurality of thermoelectric material layers and a plurality of insulating material layers; where the anisotropically elongated thermoelectric nanocomposite has a uniaxially deformed structure; and wherein the plurality of insulating material layers and the plurality of thermoelectric material layers are alternating concentric layers sharing a common central axis.

2. The anisotropically elongated thermoelectric nanocomposite of claim 1, wherein the insulating material comprises one of nanoporous oxide, nitride and fluoride aligned along the elongation direction of the thermoelectric nanocomposite.

3. The anisotropically elongated thermoelectric nanocomposite of claim 2, wherein the nanoporous oxide is at least one selected from a group consisting of $SiO_2$, $Al_2O_3$, and oxides of Ti, Zr, Hf, Nb, Ta and their alloys.

4. The anisotropically elongated thermoelectric nanocomposite of claim 3, wherein the nanoporous oxide including $SiO_2$ is fabricated by controlled oxidation of porous Si into porous silica $SiO_2$.

5. The anisotropically elongated thermoelectric nanocomposite of claim 1, wherein the insulating material forms a nanopore array, and the nanopore array is created by guided anodization with nucleation of anodized pores dictated by nano-indentation.

6. The anisotropically elongated thermoelectric nanocomposite of claim 1, wherein the insulating material forms a nanopore array, and the nanopore array is created by guided anodization with nucleation of anodized pores dictated by nano-mask patterning using at least one of a nano-imprinted resist and a thermally two-phase decomposed diblock copolymer layer.

7. The anisotropically elongated thermoelectric nanocomposite of claim 1, wherein the anisotropically elongated thermoelectric nanocomposite has average diameter of equal to or less than about 20 nm.

8. The anisotropically elongated thermoelectric nanocomposite of claim 1, wherein the anisotropically elongated thermoelectric material has average diameter of equal to or less than about 10 nm.

9. The anisotropically elongated thermoelectric nanocomposite of claim 1, wherein the thermoelectric nanocomposite has ZT value of at least about 1.5.

10. The anisotropically elongated thermoelectric nanocomposite of claim 1, wherein the thermoelectric material comprises at least one nanowire structure, and an average aspect ratio of a length thereof to a diameter thereof is at least about 2.

11. The anisotropically elongated thermoelectric nanocomposite of claim 1, wherein the thermoelectric material comprises at least one nanowire structure, and an average aspect ratio of a length thereof to a diameter thereof is at least about 5.

12. Anisotropically elongated, concentrically superlatticed thermoelectric nanocomposite comprising:
a plurality of multi-layered nanowire structures embedded in a nanoporous insulating matrix or in a nonporous insulating matrix,
wherein each of the plurality of multi-layered nanowire structures comprises:
a multi-layered cylindrical thermoelectric material; and
an insulating layer deposited between layers of the multi-layered cylindrical thermoelectric material; wherein the thermoelectric nanocomposite has a uniaxially deformed structure; and wherein the insulating layer and the layers of the multi-layered cylindrical thermoelectric material are concentric and share a common central axis.

13. The anisotropically elongated, concentrically superlatticed thermoelectric nanocomposite of claim 12, wherein each of the plurality of multi-layered nanowire structures include at least 3 layers of the multi-layered cylindrical thermoelectric material.

14. The anisotropically elongated, concentrically superlatticed thermoelectric nanocomposite of claim 12, wherein each layer of the multi-layered cylindrical thermoelectric material and the insulating layer has an average thickness of about 0.5 nm to about 2 nm.

15. The anisotropically elongated, concentrically superlatticed thermoelectric nanocomposite of claim 12, wherein the insulating layer is at least one selected from the group consisting of $SiO_2$, $Al_2O_3$, or oxides of Ca, Mg, Cr, Ti, Zr, Hf, Nb, Ta, rare earth metals or their alloys, nitrides or fluorides of Si, Al, Ca, Mg, Cr, Ti, Zr, Hf, Nb, Ta, and rare earth metals or alloys thereof.

16. The anisotropically elongated, concentrically superlatticed thermoelectric nanocomposite of claim 12, wherein the multi-layered nanowire structures are formed by alternating deposition of a thermoelectric material layer and the insulating layer using at least one of chemical vapor deposition, sputtering and an atomic layer deposition technique.

17. The anisotropically elongated, concentrically superlatticed thermoelectric nanocomposite of claim 12, wherein each layer of the multi-layered cylindrical thermoelectric material is obtained by introducing nanoparticle precipitation within each layer of the multi-layered cylindrical thermoelectric material using at least one of off-stoichiometric composition and by co-depositing an oxide-dispersoid-forming element during deposition of a concentric superlattice layer.

18. A uniaxially deformed thermoelectric nanocomposite comprising: a thermoelectric material embedded in an electrically and thermally insulating material; wherein where the thermoelectric nanocomposite has a uniaxially deformed structure; and
  wherein the thermoelectric material is at least one selected from a group consisting of Si, Si1−xGex (wherein 0<x<1), Sb3Te3, BixSb2−xTe3 (wherein 0<x<2), Bi2TexSe3−x (wherein 0<x<3), B4C/B9C, BiSb alloys, Mg—Si, Mg—Ge, Mg—Sn or their ternary systems, binary, tertiary or quaternary skutterudites, and lead-antimony-silver-tellurium (Pb—Sb—Ag—Te) thermoelectric alloys; wherein a plurality of the insulating material layers and a plurality of the thermoelectric material layers alternate with each other and are arranged concentrically such that they share a common central axis.

19. The uniaxially deformed thermoelectric nanocomposite of claim 18, wherein the thermoelectric material has an anisotropically elongated and nanofibered structure.

20. The uniaxially deformed thermoelectric nanocomposite of claim 18, wherein the thermoelectric material has a nanowire structure, and the average aspect ratio of length to diameter thereof is at least about 2.

21. The uniaxially deformed thermoelectric nanocomposite of claim 18, wherein the thermoelectric material has a nanowire structure, and the average aspect ratio of length to diameter thereof is at least about 5.

22. The uniaxially deformed, anisotropically elongated nanofibered thermoelectric nanocomposite of claim 18, wherein the electrically and thermally insulating material is at least one selected from the group consisting of oxides, nitrides or fluorides of $SiO_2$ or $Al_2O_3$, oxides of Ca, Mg, Cr, Ti, Zr, Hf, Nb, Ta, rare earth metals, and alloys of rare earth metals, and nitrides or fluorides of Si, Al, Ca, Mg, Cr, Ti, Zr, Hf, Nb, Ta, rare earth metals and alloys thereof.

23. The uniaxially deformed thermoelectric nanocomposite of claim 18, wherein the thermoelectric material is about 30% to about 90% of the volume of the thermoelectric nanocomposite, with the remaining portion being the electrically and thermally insulating material.

24. The uniaxially deformed thermoelectric nanocomposite of claim 18, wherein the thermoelectric material has phonon scattering defects, wherein the phonon scattering defects include a phonon-scattering surface roughness which increases a surface area of the thermoelectric material by at least about 20%, or wherein the phonon-scattering defects include phonon-scattering incorporated insulator particles which comprise at least 1% of the volume of the thermoelectric material, or wherein the phonon-scattering defects include phonon scattering grain boundaries with an average grain size of less than about 200 nm.

25. The uniaxially deformed thermoelectric nanocomposite of claim 18, wherein the thermoelectric material has an anisotropically elongated geometry according to a thermoelectric phase thereof and an average diameter of the uniaxially deformed thermoelectric nanocomposite is in a range of about 1 nm to about 100 nm.

26. The uniaxially deformed thermoelectric nanocomposite of claim 18, wherein a microstructure of the thermoelectric material has an increased surface area according to a thermoelectric phase thereof with a phonon-scattering surface roughness increase of at least 20% larger surface area relative to a non-phonon-scattering surface thereof.

27. The uniaxially deformed thermoelectric nanocomposite of claim 18, wherein a microstructure of the thermoelectric material has an increased number of pushed-in phonon-scattering foreign nanoparticles incorporated within the thermoelectric phase thereof, with the phonon-scattering foreign nanoparticles being at least about 1% of the thermoelectric material by volume.

28. A thermoelectric device, comprising:
  a first electrode;
  a second electrode; and
  a thermoelectric element disposed between the first electrode and the second electrode,
  wherein the thermoelectric element comprises an anisotropically elongated thermoelectric nanocomposite according to claim 1.

29. An thermoelectric apparatus, comprising:
  a heat source; and
  a thermoelectric device including:
  a first electrode which absorbs heat from the heat source;
  a second electrode disposed substantially opposite the first electrode; and
  a thermoelectric element disposed between the first electrode and the second electrode,
  wherein the thermoelectric element comprises an anisotropically elongated thermoelectric nanocomposite according to claim 1.

30. The anisotropically elongated thermoelectric nanocomposite of claim 1, wherein the thermoelectric material is at least one selected from a group consisting of Si, $Si_{1-x}Ge_x$ (wherein 0<x<1), $Bi_2Te_3$, $Sb_2Te_3$, $Bi_xSb_{2-x}Te_3$ (wherein 0<x<2), $Bi_2Te_xSe_{3-x}$ (wherein 0<x<3), $B_4C/B_9C$, BiSb alloys, PbTe, Mg—Si, Mg—Ge, Mg—Sn or their ternary systems, binary, tertiary or quaternary skutterudites, and lead-antimony-silver-tellurium (Pb—Sb—Ag—Te) thermoelectric alloys.

31. The anisotropically elongated, concentrically superlatticed thermoelectric nanocomposite of claim 12, wherein the thermoelectric material is at least one selected from a group consisting of Si, $Si_{1-x}Ge_x$ (wherein 0<x<1), $Bi_2Te_3$, $Sb_2Te_3$, $Bi_xSb_{2-x}Te_3$ (wherein 0<x<2), $Bi_2Te_xSe_{3-x}$ (wherein 0<x<3), $B_4C/B_9C$, BiSb alloys, PbTe, Mg—Si, Mg—Ge, Mg—Sn or their ternary systems, binary, tertiary or quaternary skutterudites, and lead-antimony-silver-tellurium (Pb—Sb—Ag—Te) thermoelectric alloys.

32. Anisotropically elongated, concentrically superlatticed thermoelectric nanocomposite comprising:

a plurality of multi-layered nanowire structures embedded in a nanoporous insulating matrix or in a nonporous insulating matrix, wherein each of the plurality of multi-layered nanowire structures comprises:

a plurality of thermoelectric material layers and a plurality of insulating material layers; where the anisotropically elongated thermoelectric nanocomposite has a uniaxially deformed structure; and wherein the plurality of insulating material layers and the plurality of thermoelectric material layers are alternating concentric layers sharing a common central axis.

33. The anisotropically elongated thermoelectric nanocomposite of claim 32, wherein an amount of the one of the nanoporous insulating matrix and the non insulating matrix is less than about 60% of a volume of the anisotropically elongated thermoelectric nanocomposite.

34. The anisotropically elongated thermoelectric nanocomposite of claim 32, wherein an amount of the nanoporous insulating matrix is less than about 30% of a volume of the anisotropically elongated thermoelectric nanocomposite.

* * * * *